(12) United States Patent
Ozawa et al.

(10) Patent No.: US 8,017,989 B2
(45) Date of Patent: Sep. 13, 2011

(54) NONVOLATILE SEMICONDUCTOR MEMORY DEVICE AND METHOD OF MANUFACTURING THE SAME

(75) Inventors: Yoshio Ozawa, Yokohama (JP); Ichiro Mizushima, Yokohama (JP); Takashi Nakao, Yokohama (JP); Akihito Yamamoto, Naka-gun (JP); Takashi Suzuki, Yokohama (JP); Masahiro Kiyotoshi, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/659,703

(22) Filed: Mar. 17, 2010

(65) Prior Publication Data

US 2010/0171164 A1 Jul. 8, 2010

Related U.S. Application Data

(62) Division of application No. 12/145,109, filed on Jun. 24, 2008, now abandoned.

(30) Foreign Application Priority Data

Jun. 26, 2007 (JP) ................................. 2007-167997

(51) Int. Cl.
*H01L 29/788* (2006.01)

(52) U.S. Cl. ... 257/315; 257/347; 257/349; 257/E21.32; 257/E27.103

(58) Field of Classification Search .................. 257/315, 257/347, 349, E21.32, E27.103
See application file for complete search history.

(56) References Cited

U.S. PATENT DOCUMENTS

| | | | |
|---|---|---|---|
| 5,585,304 A | * | 12/1996 | Hayashi et al. ............... 438/459 |
| 6,115,287 A | | 9/2000 | Shimizu et al. |
| 6,937,514 B2 | * | 8/2005 | Hasegawa ............... 365/185.12 |
| 2002/0072175 A1 | | 6/2002 | Chang et al. |
| 2003/0042528 A1 | | 3/2003 | Forbes |
| 2005/0169096 A1 | | 8/2005 | Lee et al. |
| 2005/0280000 A1 | | 12/2005 | Ishii et al. |

(Continued)

FOREIGN PATENT DOCUMENTS

JP 2006-73939 3/2006

(Continued)

OTHER PUBLICATIONS

Notification for Filing Opinion Issued by Korean Patent Office for Korean Application No. 10-2008-60277 (10 pages).

(Continued)

*Primary Examiner* — Bradley K Smith
*Assistant Examiner* — Mohammad T Karimy
(74) *Attorney, Agent, or Firm* — Finnegan, Henderson, Farabow, Garrett & Dunner, L.L.P.

(57) ABSTRACT

A nonvolatile semiconductor memory device including a semiconductor substrate having a semiconductor layer and an insulating material provided on a surface thereof, a surface of the insulating material is covered with the semiconductor layer, and a plurality of memory cells provided on the semiconductor layer, the memory cells includes a first dielectric film provided by covering the surface of the semiconductor layer, a plurality of charge storage layers provided above the insulating material and on the first dielectric film, a plurality of second dielectric films provided on the each charge storage layer, a plurality of conductive layers provided on the each second dielectric film, and an impurity diffusion layer formed partially or overall at least above the insulating material and inside the semiconductor layer and at least a portion of a bottom end thereof being provided by an upper surface of the insulating material.

3 Claims, 32 Drawing Sheets

U.S. PATENT DOCUMENTS

| | | |
|---|---|---|
| 2008/0073635 A1 | 3/2008 | Kiyotoshi et al. |
| 2008/0157092 A1 | 7/2008 | Arai et al. |

FOREIGN PATENT DOCUMENTS

| | | |
|---|---|---|
| JP | 2006-294940 | 10/2006 |
| JP | 2006-351881 | 12/2006 |
| JP | 2007-110029 | 4/2007 |
| KR | 2006-128567 | 12/2006 |
| KR | 10-0669353 | 1/2007 |

OTHER PUBLICATIONS

Notice of Reasons for Rejection issued by the Japanese Patent Office on Oct. 13, 2009, for Japanese Patent Application No. 2007-167997, and English-language translation thereof.

* cited by examiner

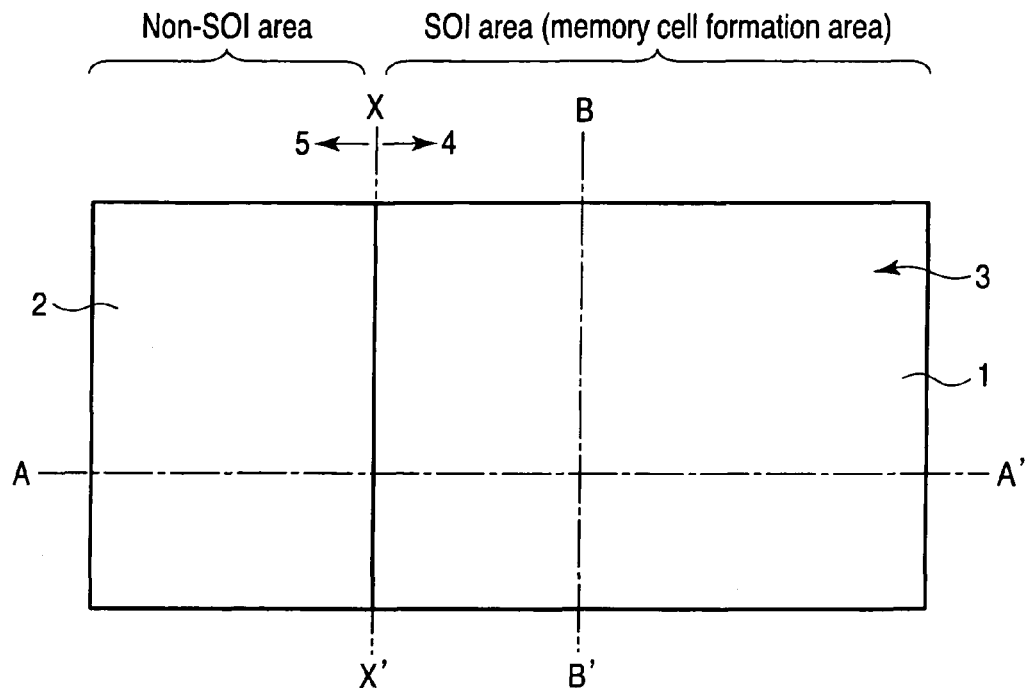
F I G. 1A
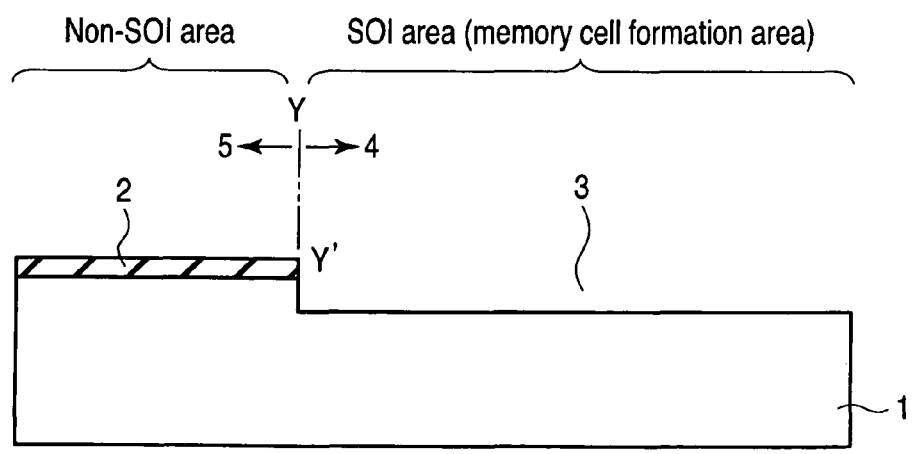
F I G. 1B
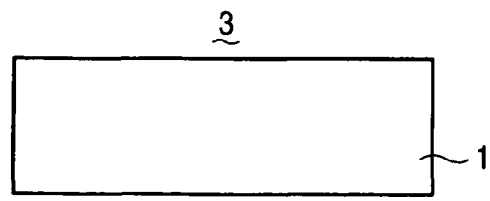
F I G. 1C

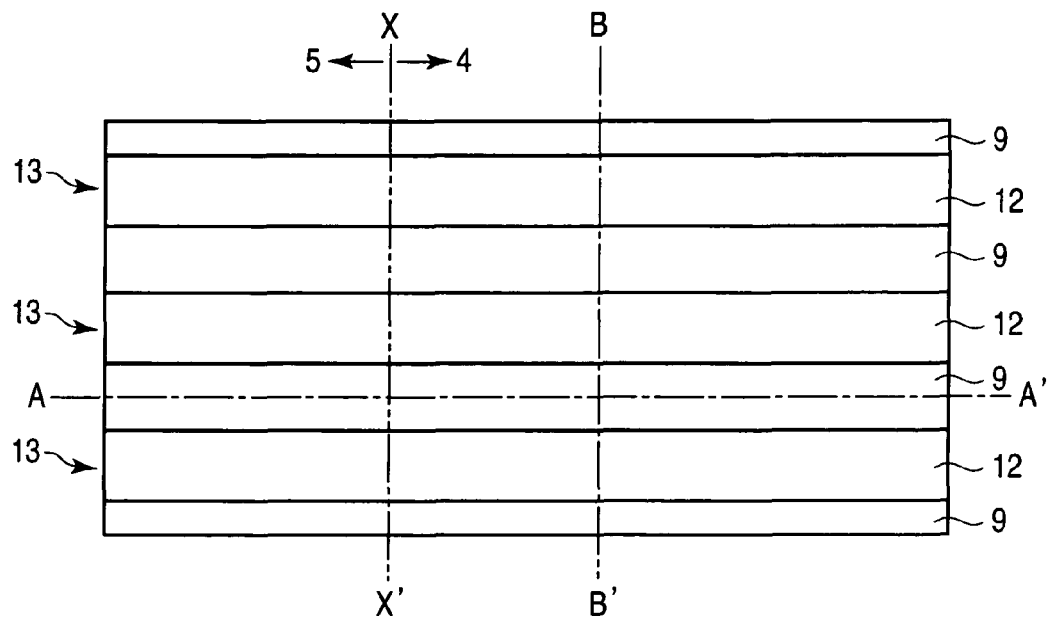
F I G. 5A
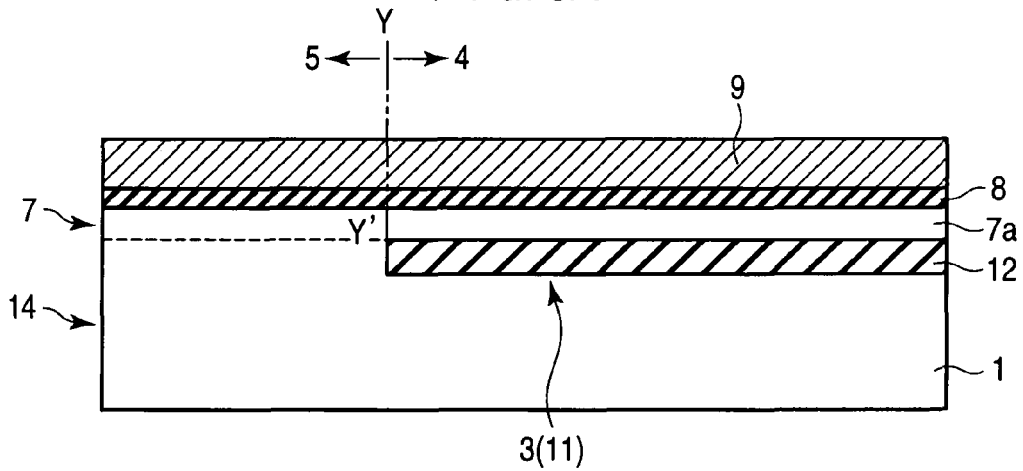
F I G. 5B
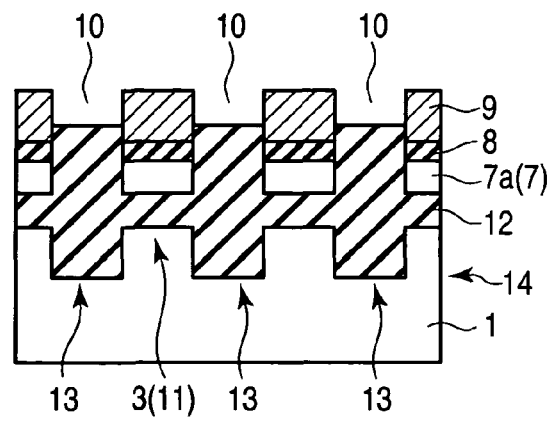
F I G. 5C

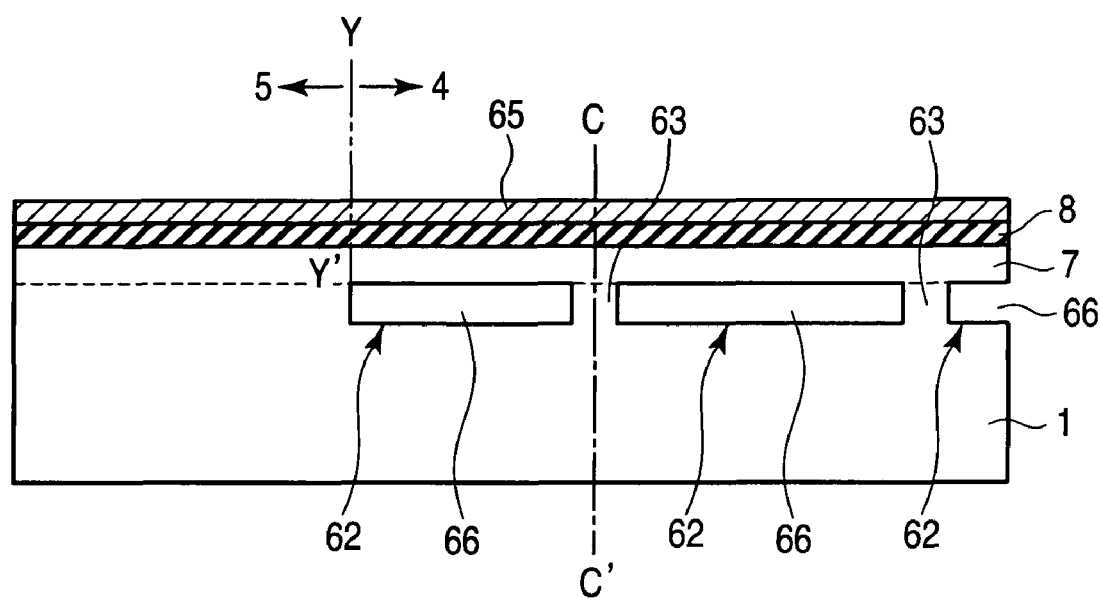
F I G. 15A
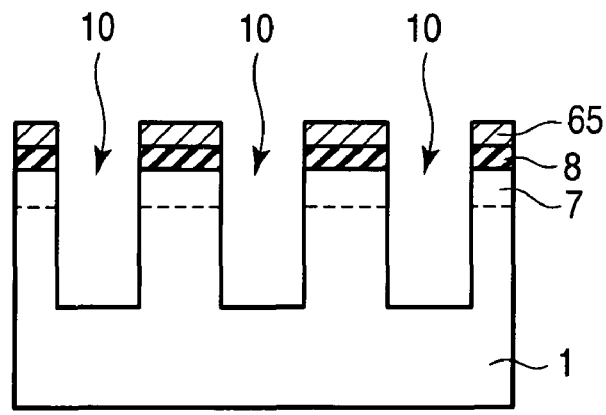
F I G. 15B

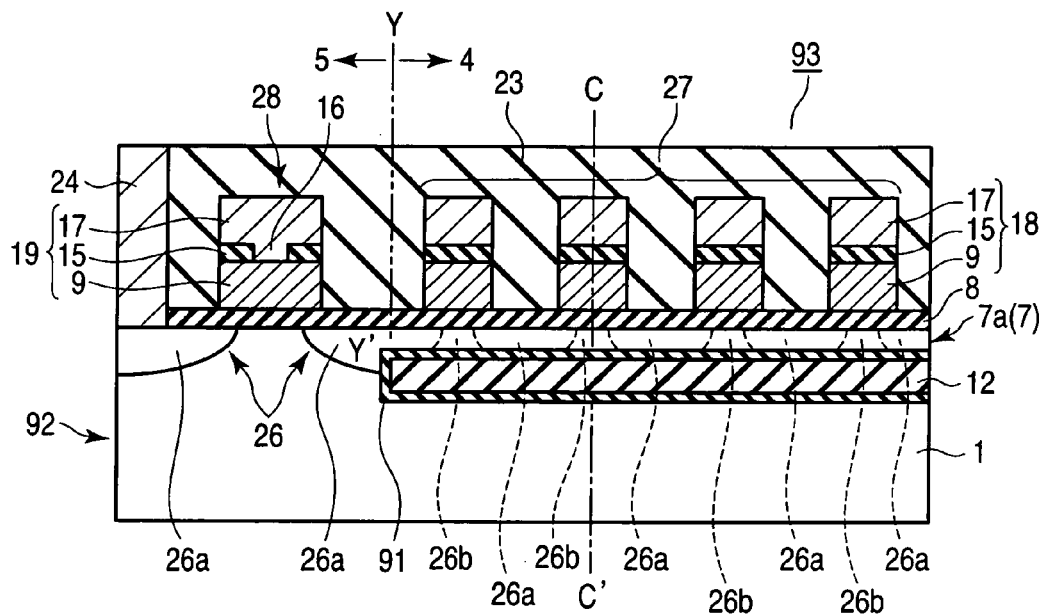
F I G. 20A
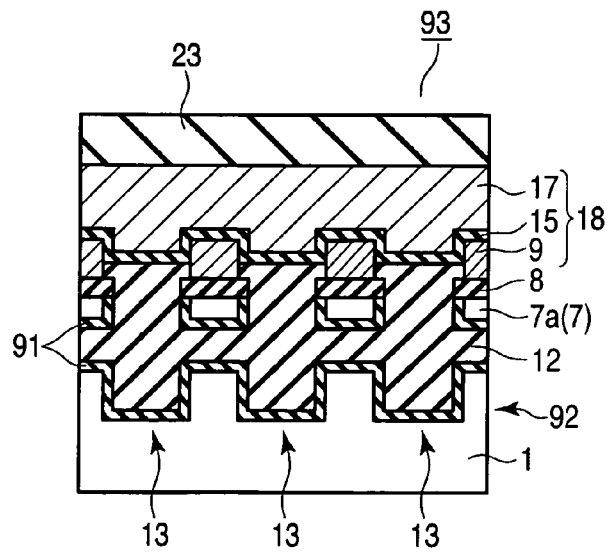
F I G. 20B

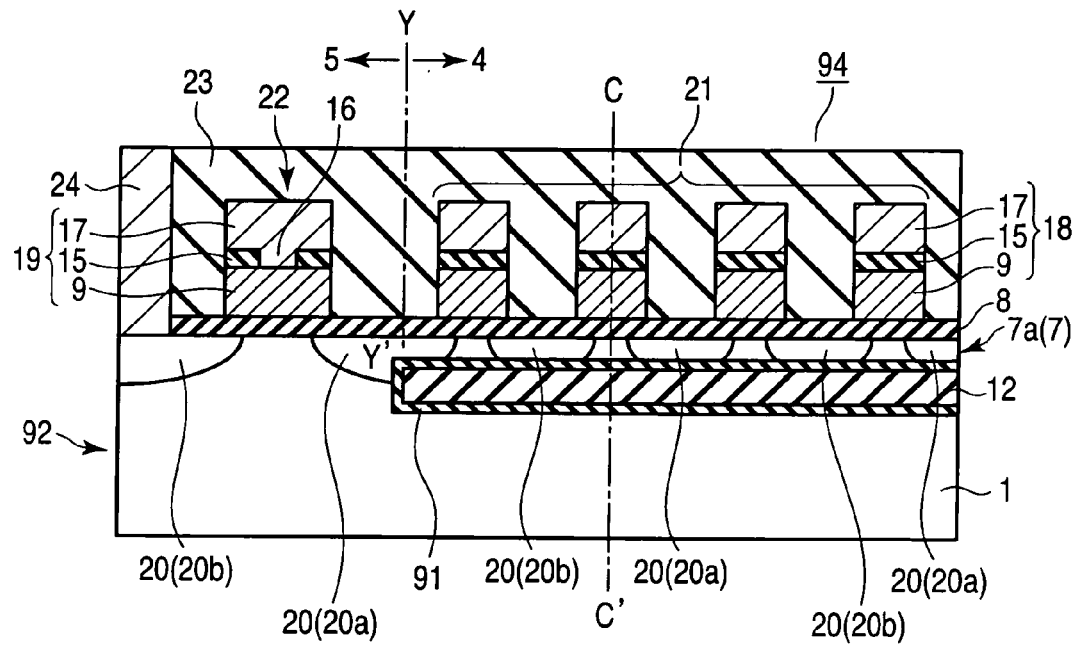
F I G. 21A
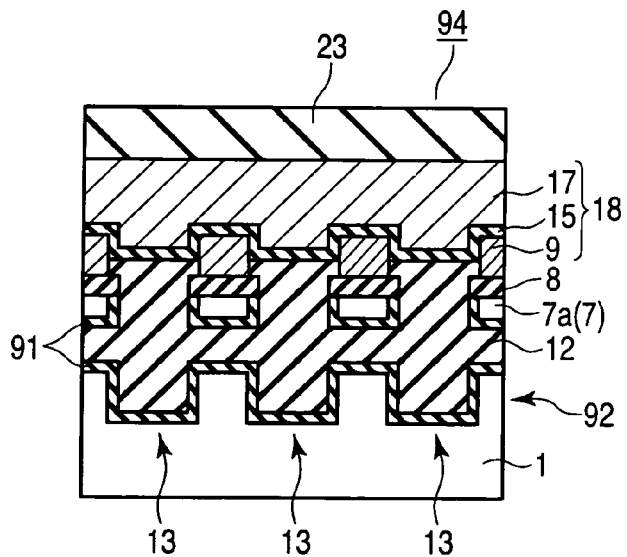
F I G. 21B

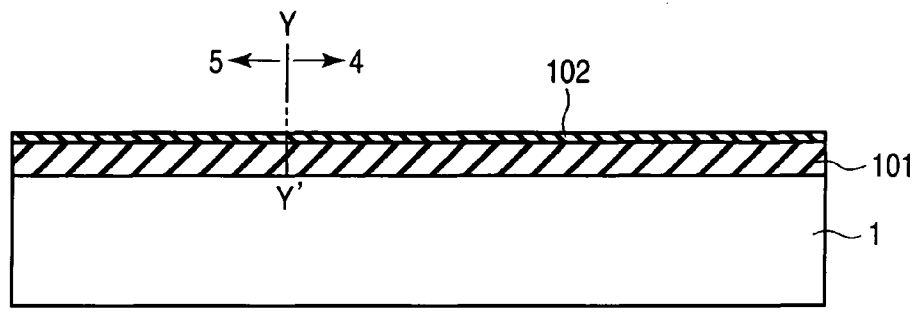
F I G. 22A
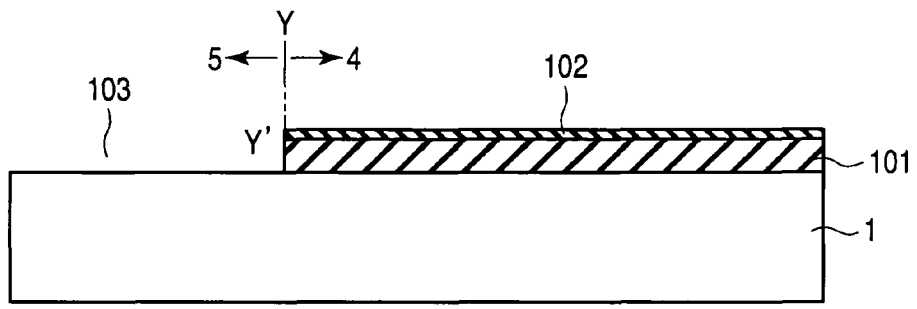
F I G. 22B
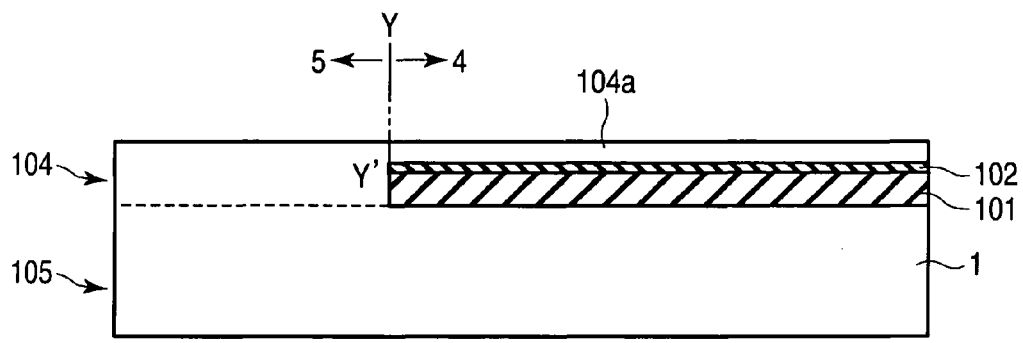
F I G. 22C
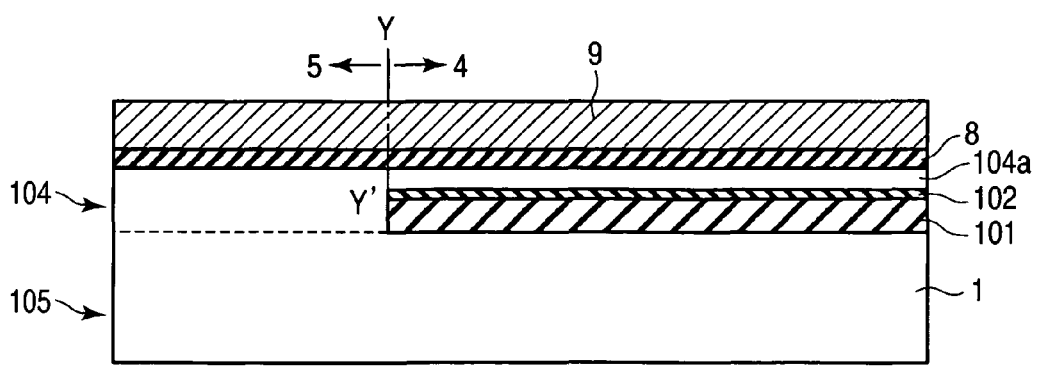
F I G. 22D

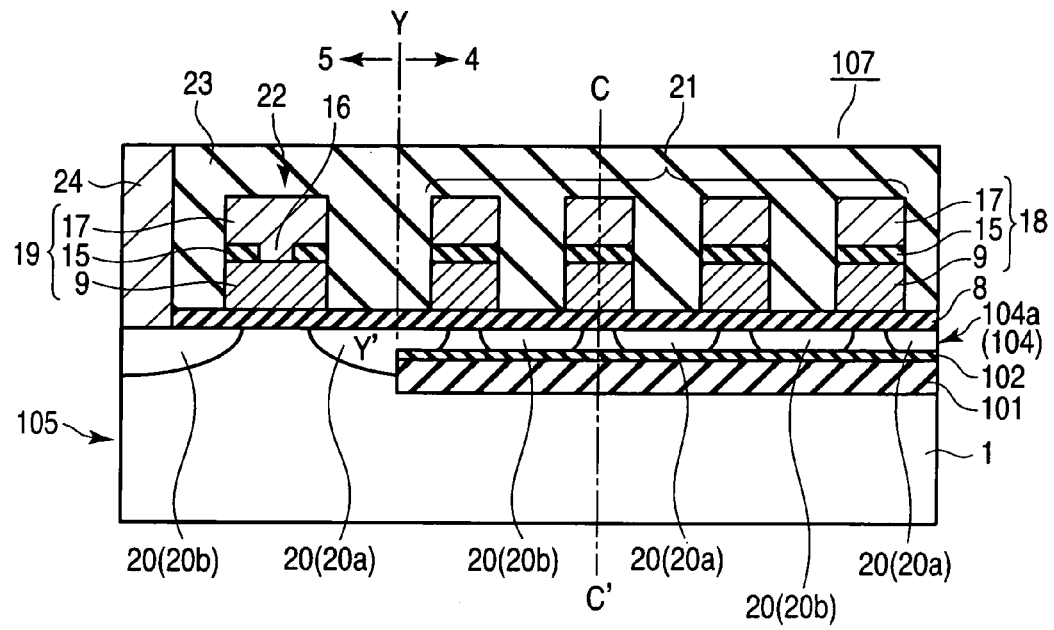
F I G. 24A
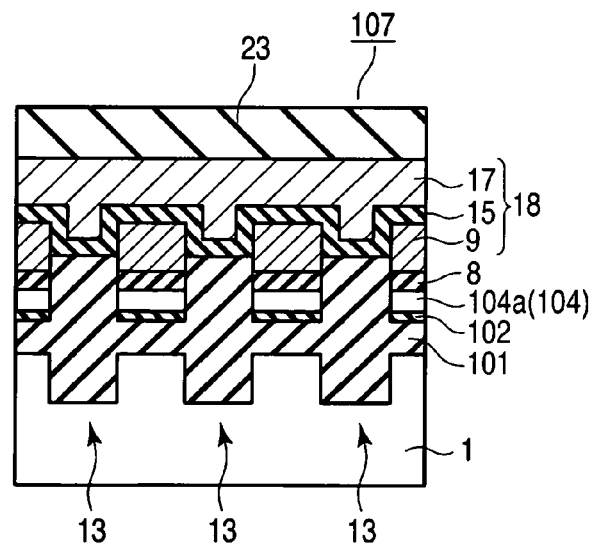
F I G. 24B

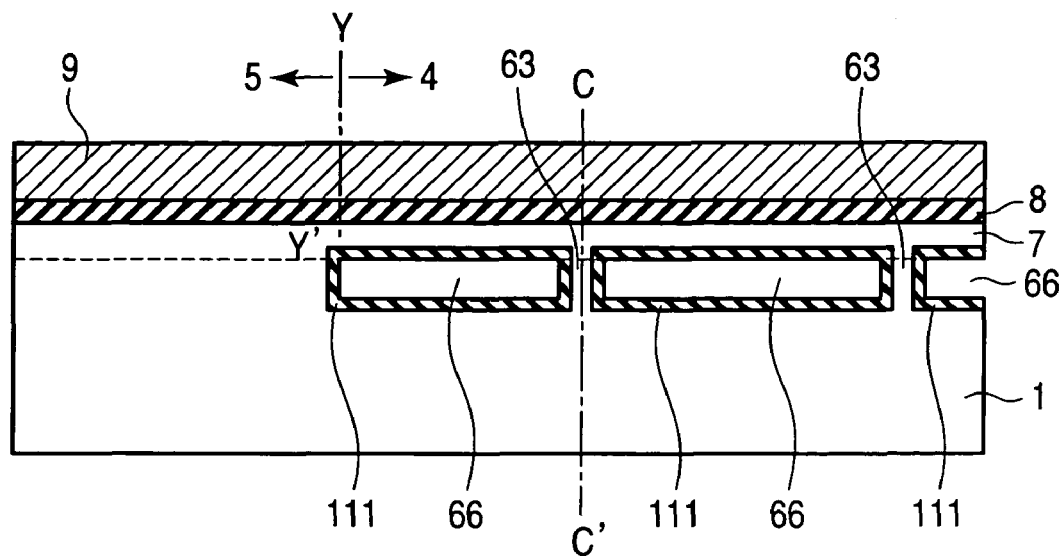
F I G. 25A
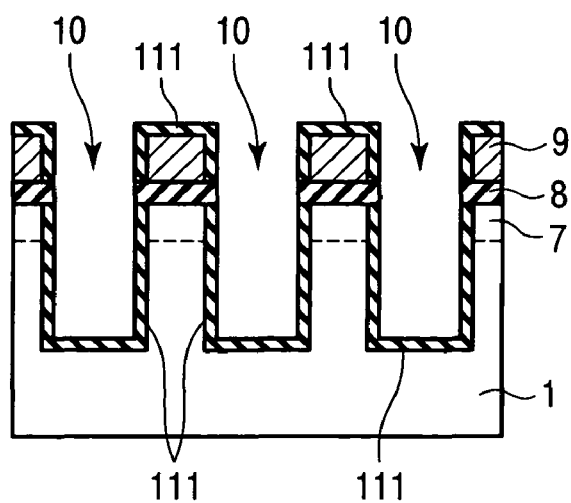
F I G. 25B

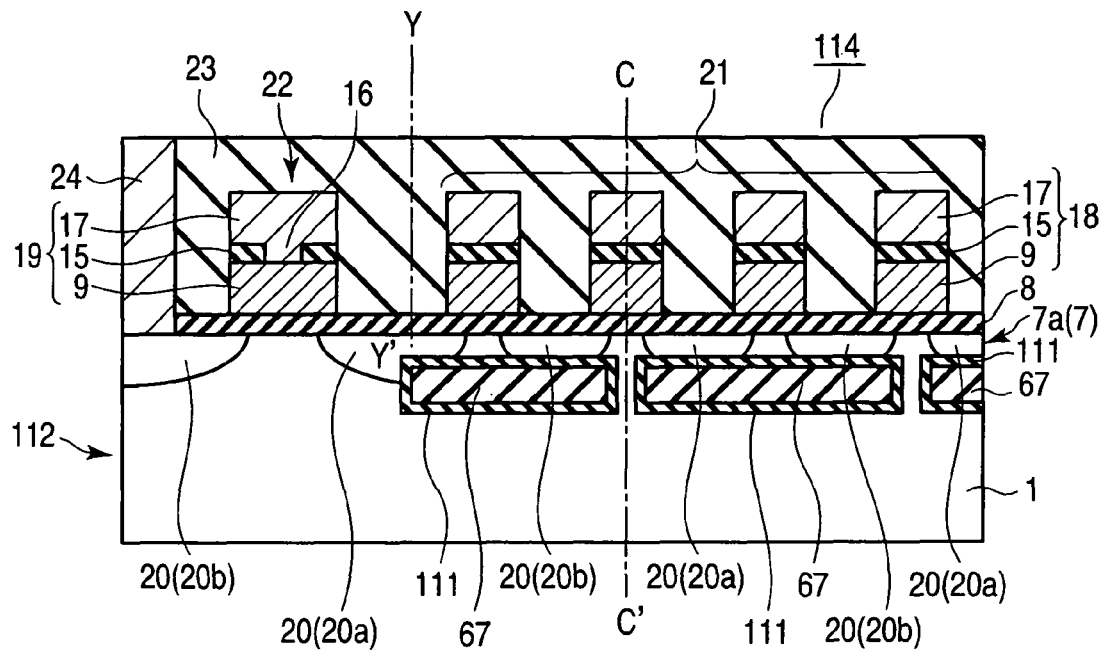
F I G. 27A
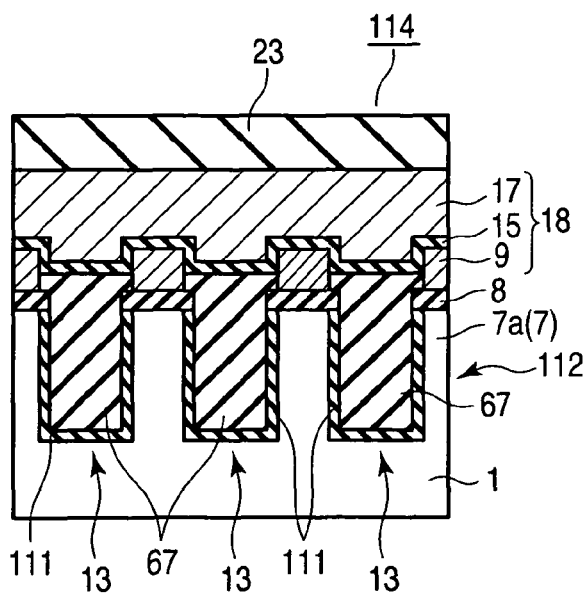
F I G. 27B

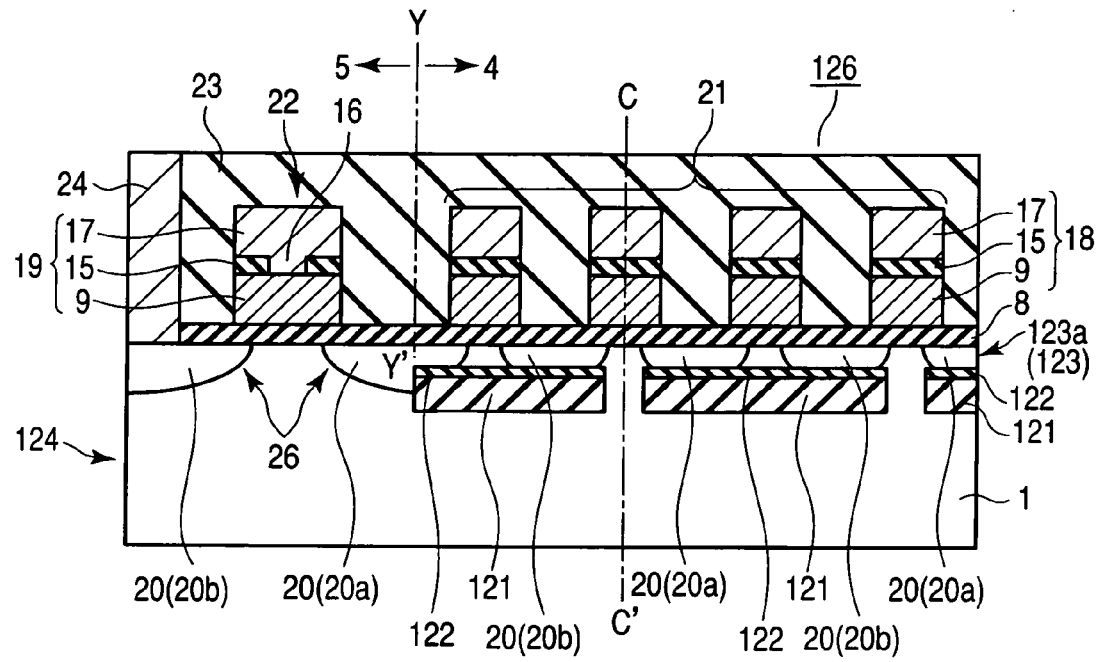
F I G. 32A
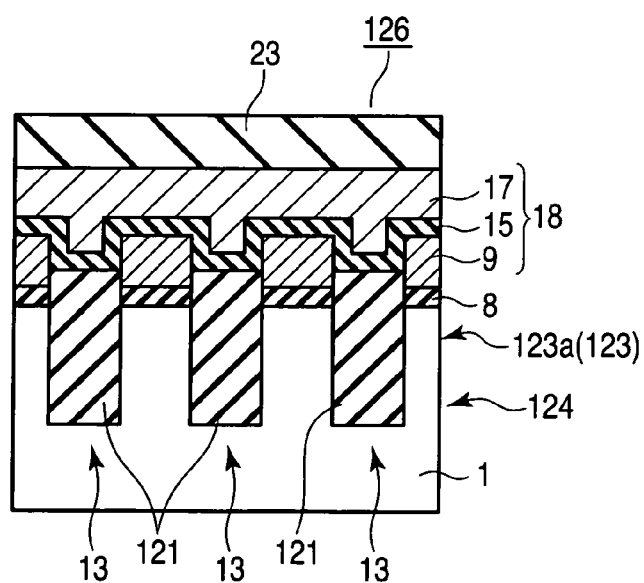
F I G. 32B

NONVOLATILE SEMICONDUCTOR MEMORY DEVICE AND METHOD OF MANUFACTURING THE SAME

CROSS-REFERENCE TO RELATED APPLICATIONS

This is a division of application Ser. No. 12/145,109, filed Jun. 24, 2008 now abandoned, which is incorporated herein by reference.

This application is based upon and claims the benefit of priority from prior Japanese Patent Application No. 2007-167997, filed Jun. 26, 2007, the entire contents of which are incorporated herein by reference.

BACKGROUND OF THE INVENTION

1. Field of the Invention

The present invention relates to a nonvolatile semiconductor memory device and a method of manufacturing the same, and in particular, relates to a nonvolatile semiconductor memory device having memory cells in an SOI (Silicon on Insulator) area of a semiconductor substrate partially containing an SOI structure, and a method of manufacturing the same.

2. Description of the Related Art

In a nonvolatile semiconductor memory device having a memory cell part of a general NAND structure as disclosed in Jpn. Pat. Appln. KOKAI Publication No. 2006-073939, for example, it is difficult to further reduce dimensions of memory cells. More specifically, if the channel length of a memory cell is set to about 50 nm or less, the memory cell or a transistor is more likely to malfunction due to a reduced on/off ratio of a channel current caused by the so-called short channel effect. Then, reliability, performance or quality of the entire nonvolatile semiconductor memory device deteriorates. Also, manufacturing efficiency drops due to lower yields caused by more frequent defective products. Thus, it has been difficult for a conventional nonvolatile semiconductor memory device to achieve higher integration of the entire device by making memory cells finer.

BRIEF SUMMARY OF THE INVENTION

According to an aspect of the invention, there is provided a nonvolatile semiconductor memory device comprising: a semiconductor substrate having a semiconductor layer and an insulating material provided on a surface thereof, a surface of the insulating material is covered with the semiconductor layer; a plurality of memory cells provided on the semiconductor layer, the memory cells comprising: a first dielectric film provided by covering the surface of the semiconductor layer; a plurality of charge storage layers, each of which is provided above the insulating material and on the first dielectric film; a plurality of second dielectric films, each of which is provided on the each charge storage layer; a plurality of conductive layers, each of which is provided on the each second dielectric film; and an impurity diffusion layer formed partially or overall at least above the insulating material and inside the semiconductor layer and at least a portion of a bottom end thereof being provided by an upper surface of the insulating material.

According to another aspect of the invention, there is provided a method of manufacturing a nonvolatile semiconductor memory device, comprising: providing a sacrificial layer inside at least one recess formed in a surface layer part by being partially lowered from a surface of a semiconductor substrate and providing a semiconductor layer by covering the surface of the sacrificial layer and that of the semiconductor substrate; providing a first dielectric film and a charge storage layer in a stacked structure by covering the surface of the semiconductor layer and forming a plurality of trenches extending into the semiconductor substrate positioned lower than the sacrificial layer by cutting through the charge storage layer, the first dielectric film, the semiconductor layer, and the sacrificial layer; forming cavities communicatively connected to the each trench inside the semiconductor substrate by selectively removing the sacrificial layer from inside the semiconductor substrate and providing an insulating material inside the each trench until an upper surface of the insulating material becomes higher than that of the first dielectric film while the insulating material being provided inside the cavities via the each trench; providing a second dielectric film and a conductive layer in the stacked structure by covering the surface of the insulating material provided inside the each trench and that of the charge storage layer and leaving a plurality of stacked structures comprised of the conductive layer, the second dielectric film, and the charge storage layer at least above the insulating material and on the first dielectric film by partially removing the conductive layer, the second dielectric film, and the charge storage layer provided at least inside the cavities above the insulating material until the surface of the first dielectric film is exposed; and forming an impurity diffusion layer by partially feeding impurities at least into the semiconductor layer above the insulating material using the each stacked structure as a mask or feeding fully the impurities into at least the semiconductor layer in advance before removing the sacrificial layer.

BRIEF DESCRIPTION OF THE SEVERAL VIEWS OF THE DRAWING

FIGS. 1A, 1B, and 1C are diagrams showing manufacturing processes of a nonvolatile semiconductor memory device according to a first embodiment;

FIGS. 5A, 5B, and 5C are diagrams showing manufacturing processes of the nonvolatile semiconductor memory device according to the first embodiment;

FIGS. 15A and 15B are sectional views showing manufacturing processes of the nonvolatile semiconductor memory device according to the third embodiment;

FIGS. 20A and 20B are sectional views showing manufacturing processes of the nonvolatile semiconductor memory device according to the fourth embodiment;

FIGS. 21A and 21B are sectional views showing a first modification of the nonvolatile semiconductor memory device according to the fourth embodiment;

FIGS. 22A, 22B, 22C and 22D are sectional views showing manufacturing processes of a second modification of the nonvolatile semiconductor memory device according to the fourth embodiment;

FIGS. 24A and 24B are sectional views showing a third modification of the nonvolatile semiconductor memory device according to the fourth embodiment;

FIGS. 25A and 25B are sectional views showing manufacturing processes of a fourth modification of the nonvolatile semiconductor memory device according to the fourth embodiment;

FIGS. 27A and 27B are sectional views showing a fifth modification of the nonvolatile semiconductor memory device according to the fourth embodiment;

FIGS. 32A and 32B are sectional views showing a seventh modification of the nonvolatile semiconductor memory device according to the fourth embodiment.

DETAILED DESCRIPTION OF THE INVENTION

Figure 2A:
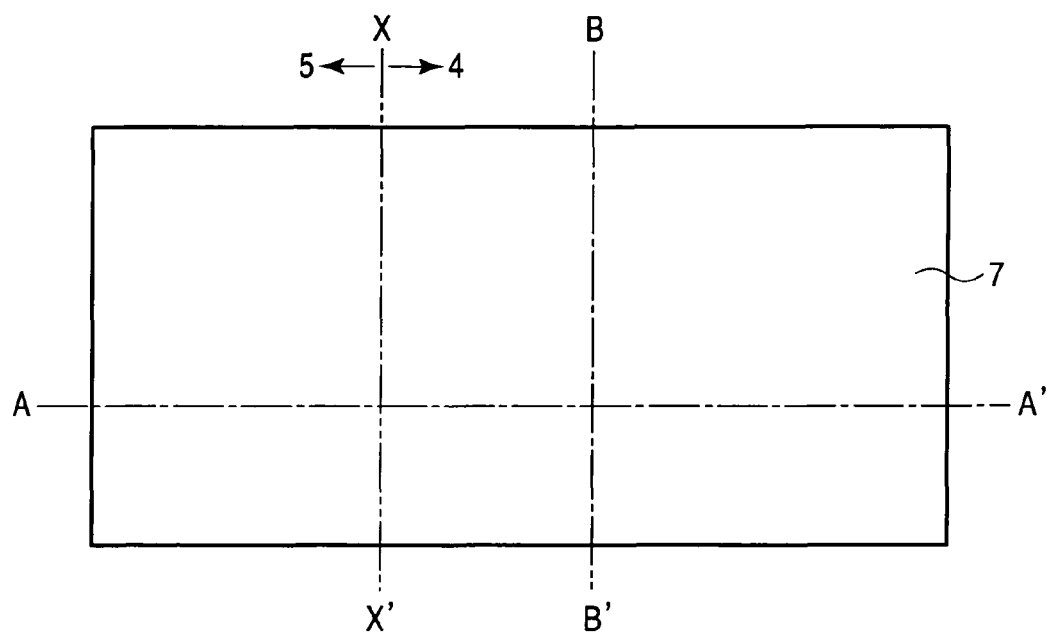
FIGS. 2A, 2B, and 2C are diagrams showing manufacturing processes of the nonvolatile semiconductor memory device according to the first embodiment.

Embodiments according to the present invention will be described below with reference to the drawings.

First Embodiment

First, a first embodiment according to the present invention will be described with reference to FIGS. 1A to 9B. In the present embodiment, a partial SOI substrate partially having an SOI (Silicon on Insulator) structure is formed by providing a semiconductor layer having excellent crystallizability by covering the surface of a semiconductor substrate in which an insulating layer is partially provided. Then, a nonvolatile semiconductor memory device, for which memory cells are made finer and avoidance of a malfunction is achieved, is manufactured by providing memory cells in the semiconductor layer above the insulating layer of the partial SOI substrate.

First, as shown in FIGS. 1A, 1B, and 1C, a silicon oxide film 2 is provided by covering the surface of a p-type silicon crystal substrate 1 as a semiconductor substrate. Then, though not shown, a resist film covering the surface of the silicon oxide film 2 is provided and the resist film is patterned to a pattern covering a non-SOI area 5 while exposing an SOI area 4 described later. Subsequently, the silicon oxide film 2 is partially removed by using the patterned resist film as a mask to expose the surface of the silicon crystal substrate 1 in the SOI area 4. Then, after removing the resist film from the surface of the silicon crystal substrate 1, an exposed area of the silicon crystal substrate 1 is caused to recede by about 50 nm from the surface of the silicon crystal substrate 1 by etching the exposed area using the RIE (Reactive Ion Etching) method or the like. A recess 3 of about 50 nm in depth consisting of the exposed area of the silicon crystal is thereby formed at one location of a surface layer part of the silicon crystal substrate 1 in the SOI area 4.

FIG. 1A is a plan view showing the vicinity of an area where a memory cell of a nonvolatile semiconductor memory device according to the present embodiment is formed by viewing from above. FIG. 1B is a sectional view showing along a break line A-A' in FIG. 1A. More specifically, FIG. 1B is a sectional view showing along a channel length direction (bit line direction) of the nonvolatile semiconductor memory device according to the present embodiment. FIG. 1C is a sectional view showing along a break line B-B' in FIG. 1A. More specifically, FIG. 1C is a sectional view showing along a channel width direction (word line direction) of the nonvolatile semiconductor memory device according to the present embodiment. Such relationships among FIGS. 1A, 1B, and 1C also apply to FIGS. 2A, 2B, and 2C to FIGS. 8A, 8B, and 8C, and FIGS. 12A, 12B, and 12C to be referenced later.

As shown in FIGS. 1A and 1B, among areas on the surface of the silicon crystal substrate 1, an area where the recess 3 is formed on the right side of a chain double-dashed line X-X' in FIG. 1A and a chain double-dashed line Y-Y' in FIG. 1B becomes the SOI area 4 to be described later. An area on the left side of the chain double-dashed line X-X' in FIG. 1A and the chain double-dashed line Y-Y' in FIG. 1B becomes the non-SOI area 5 to be described later. Then, the SOI area 4 becomes a main part in the formation area of a memory cell. These definitions of the SOI area 4 and the non-SOI area 5 in FIGS. 1A and 1B also apply to FIGS. 2A and 2B to FIGS. 32A and 32B.

Figure 2B:
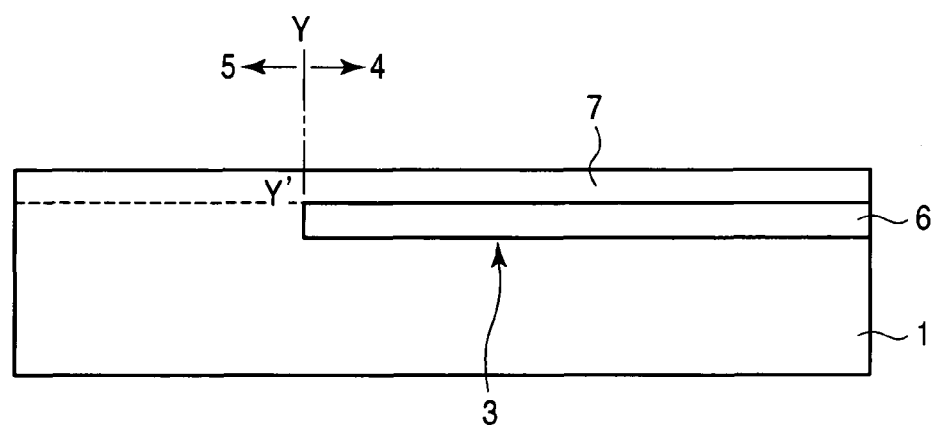
Figure 2C:
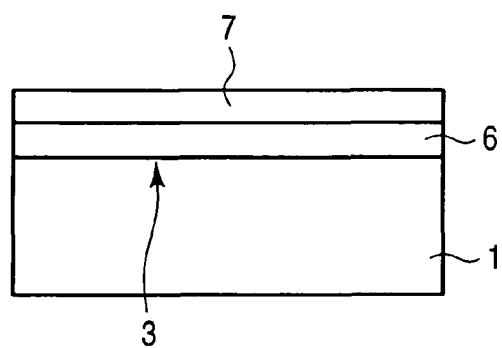

Next, as shown in FIGS. 2B and 2C, a sacrificial layer 6 for forming a cavity inside the silicon crystal substrate 1 later is provided in the recess 3 formed in the surface layer part of the silicon crystal substrate 1. Here, the epitaxial growth method is applied to a silicon crystal serving as a substrate (seed layer) using a material gas containing dichlorsilane and germane to form the sacrificial layer 6. This allows selective epitaxial growth of a silicon-germanium mixed crystal layer, which is to be the sacrificial layer 6, up to a thickness of about 50 nm, between the surface of the silicon oxide film 2 and the exposed surface of the silicon crystal substrate 1, on the exposed surface of the silicon crystal substrate 1 constituting the recess 3. As a result, the recess 3 is filled with the silicon-germanium mixed crystal layer 6. Then, the silicon oxide film 2 remaining on the silicon crystal substrate 1 is removed using dilute fluoric acid or the like to expose the surface of the silicon crystal substrate 1.

Experiments performed by the inventors showed that the silicon-germanium mixed crystal layer 6 with almost no crystal defect observed inside and excellent in surface flatness can be formed by setting the concentration of the germanium element in the silicon-germanium mixed crystal layer 6 generally to 40% or less by controlling the flow rate of dichlorsilane and germane in the material gas. The silicon-germanium mixed crystal layer 6 is temporarily embedded in the recess 3 to reserve an area to be a cavity later inside the silicon crystal substrate 1 and thus is also called an embedded spacer layer.

Subsequently, a semiconductor layer 7 to be an SOI layer later is provided on the silicon crystal substrate 1 from which the silicon oxide film 2 has been removed. Here, the semiconductor layer 7 made of a single material is formed at a time on the silicon crystal substrate 1 and the silicon-germanium mixed crystal layer 6 made of mutually different materials. Thus, a material gas containing elements common to both the silicon crystal substrate 1 and the silicon-germanium mixed crystal layer 6 is used while the epitaxial growth method is applied to a substrate made of a material common to both the silicon crystal substrate 1 and the silicon-germanium mixed crystal layer 6. More specifically, silane, dichlorsilane or the like containing the silicon element is used as a material gas and the epitaxial growth method is applied to a substrate made of silicon crystals.

According to the method described above, as shown in FIGS. 2A, 2B, and 2C, the single silicon crystal layer 7 that has substantially the same thickness on the silicon crystal substrate 1 and on the silicon-germanium mixed crystal layer 6 can be formed at a time on both the exposed surface of the silicon crystal substrate 1 and the surface of the silicon-germanium mixed crystal layer 6. The single silicon crystal layer 7 is epitaxially grown overall covering both the exposed surface of the silicon crystal substrate 1 and the surface of the silicon-germanium mixed crystal layer 6 until the thickness thereof reaches about 50 nm. At this point, the single silicon crystal layer 7 epitaxially grows while being integrated with the silicon crystal substrate 1. Moreover, the single silicon crystal layer 7 is formed by the epitaxial growth method mainly grown along the longitudinal direction (the thickness direction or height direction). As a result, the silicon crystal layer 7 having very excellent crystallizability as a substrate of memory cells can be obtained with almost no crystal grain boundary, twin crystal or the like observed inside.

Figure 3A:
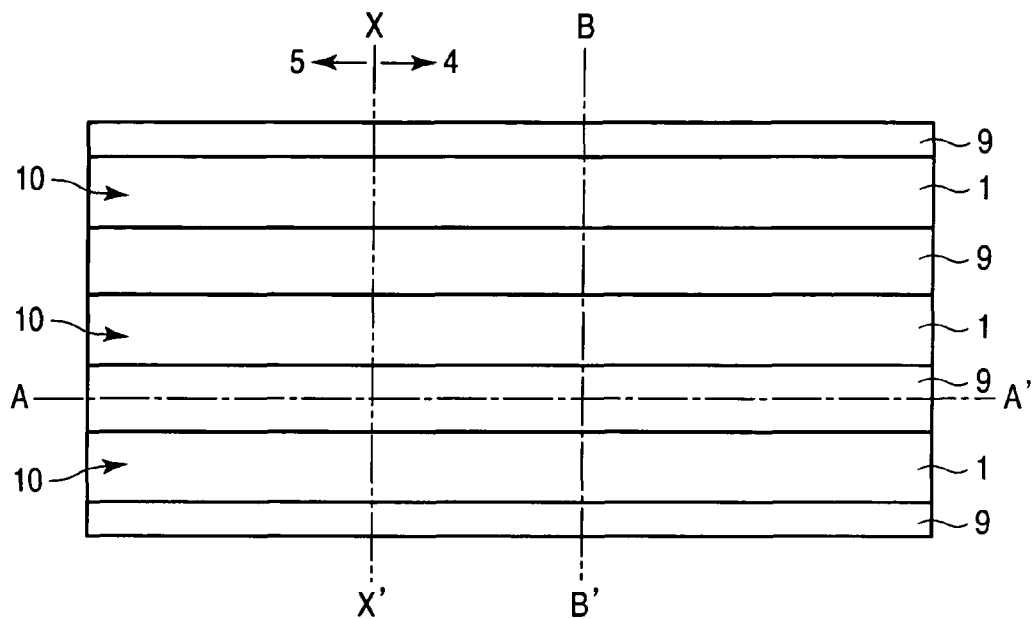
FIGS. 3A, 3B, and 3C are diagrams showing manufacturing processes of the nonvolatile semiconductor memory device according to the first embodiment.
Figure 3B:
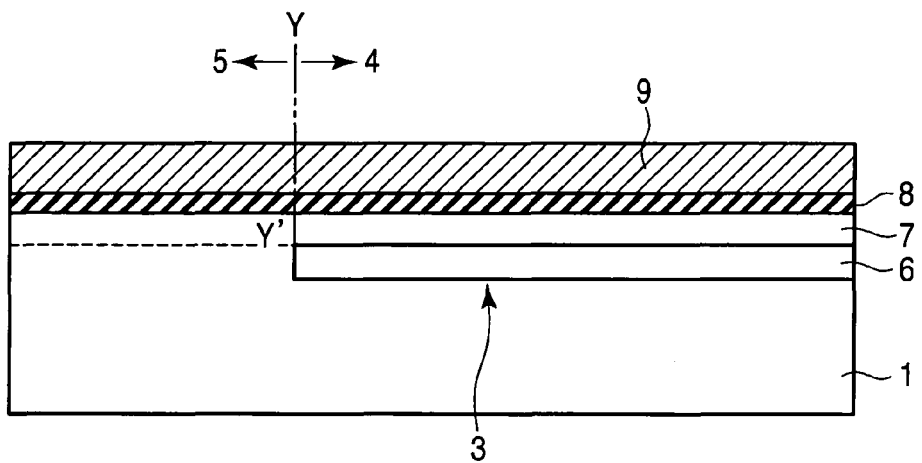
Figure 3C:
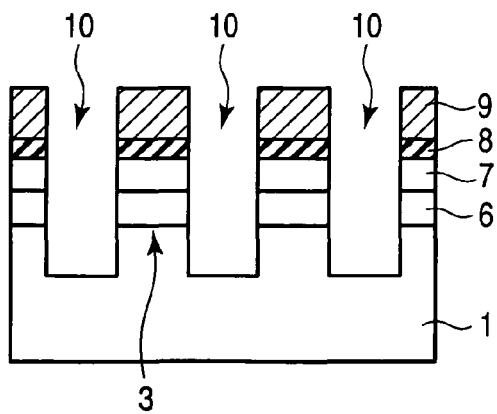

Next, as shown in FIGS. 3B and 3C, a first dielectric film 8 to be a gate dielectric film (tunnel dielectric film) is provided by covering the surface of the silicon crystal layer 7. Here, a silicon oxide film to be the first dielectric film 8 is formed overall on the surface of the silicon crystal layer 7 up to a thickness of about 7 nm by the thermal oxidation method or the like. Subsequently, a charge storage layer 9 to be a floating-gate electrode is provided by covering the entire surface of the silicon oxide film 8. Here, a polysilicon layer to which an impurity phosphorus is added is caused to deposit as the charge storage layer 9 on the surface of the silicon oxide film 8 up to a thickness of about 50 nm by the CVD (Chemical Vapor Deposition) method or the like.

Subsequently, though not shown, a resist film is provided by covering the surface of the phosphorus-doped polysilicon layer 9 and the resist film is patterned to a stripe shape by fitting to a pattern of an isolation region 13 described later. Subsequently, as shown in FIGS. 3A and 3C, the patterned resist film is used as a mask to partially cut off and remove the phosphorus-doped polysilicon layer 9, the silicon oxide film 8, the silicon crystal layer 7, the silicon-germanium mixed crystal layer 6, and the silicon crystal substrate 1 are using the RIE method or the like. A plurality of isolation trenches 10 to form the isolation region 13 is thereby formed. At this point, the depth of each of the isolation trenches 10 is adjusted so that the bottom of each of the isolation trenches 10 extends deeper than the undersurface of the silicon-germanium mixed crystal layer 6.

As a result, in the SOI area 4, as shown in FIG. 3C, each of the isolation trenches 10 extends into the silicon crystal substrate 1 below the undersurface of the silicon-germanium mixed crystal layer 6 by cutting through the phosphorus-doped polysilicon layer 9, the silicon oxide film 8, the silicon crystal layer 7, and the silicon-germanium mixed crystal layer 6. Then, sides of the silicon-germanium mixed crystal layer 6 are substantially exposed almost completely to the inside of each of the isolation trenches 10. In the non-SOI area 5, on the other hand, each of the isolation trenches 10 extends into the silicon crystal substrate 1 below the undersurface of the silicon-germanium mixed crystal layer 6 by cutting through the phosphorus-doped polysilicon layer 9, the silicon oxide film 8, and the silicon crystal layer 7. After forming each of the isolation trenches 10, the resist film on the phosphorus-doped polysilicon layer 9 is removed to expose the surface of the phosphorus-doped polysilicon layer 9.

Figure 4A:
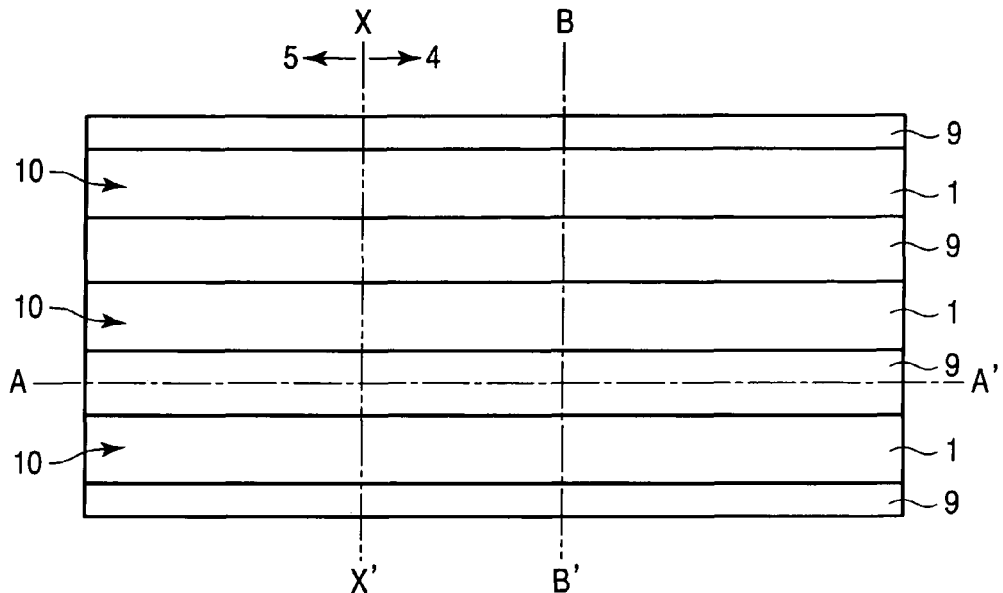
FIGS. 4A, 4B, and 4C are diagrams showing manufacturing processes of the nonvolatile semiconductor memory device according to the first embodiment.
Figure 4B:
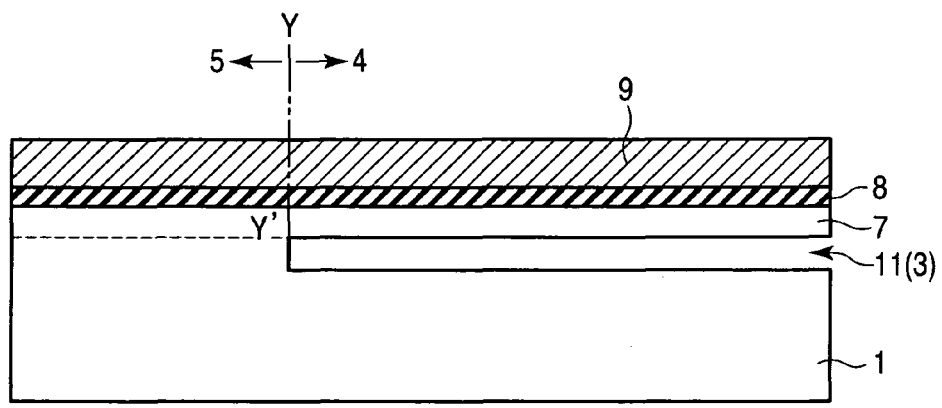
Figure 4C:
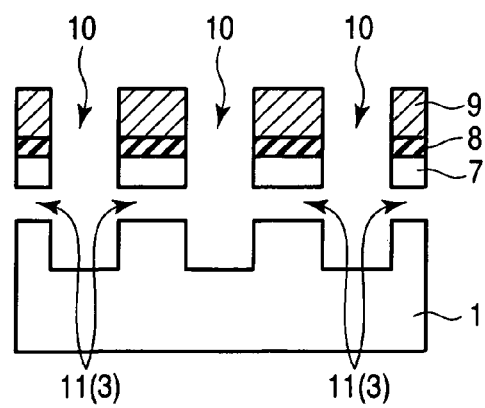

Next, as shown in FIGS. 4B and 4C, a cavity 11 is formed inside the silicon crystal substrate 1 in which each of the isolation trenches 10 is formed. Here, a chemical solution obtained by adding fluoric acid to nitric acid or the like is supplied to the inside of each of the isolation trenches 10 where sides of the silicon-germanium mixed crystal layer 6 are exposed to perform chemical etching to the silicon-germanium mixed crystal layer 6. The silicon-germanium mixed crystal layer 6 as an embedded spacer layer (sacrificial layer) is thereby selectively removed from inside the silicon crystal substrate 1 to form the cavity 11 communicatively connected to each of the isolation trenches 10 inside the silicon crystal substrate 1.

However, among the phosphorus-doped polysilicon layer 9, the silicon oxide film 8, the silicon crystal layer 7, the silicon-germanium mixed crystal layer 6, and the silicon crystal substrate 1 containing silicon in common, only the etching rate of the silicon oxide film 8 is slower than that of other members 9, 7, 6, and 1. Moreover, there is no large difference in etching rate between the phosphorus-doped polysilicon layer 9 and the silicon-germanium mixed crystal layer 6 so that the processing selection ratio by etching between the phosphorus-doped polysilicon layer 9 and the silicon-germanium mixed crystal layer 6 is small. Thus, if chemical etching to remove the silicon-germanium mixed crystal layer 6 is performed in a state formed by processes up to now, not only the silicon-germanium mixed crystal layer 6, but also the phosphorus-doped polysilicon layer 9, the silicon crystal layer 7, and the silicon crystal substrate 1 are cut off.

To avoid such a situation, though not shown, the concentration of phosphorus in the phosphorus-doped polysilicon layer 9 is further increased in the present embodiment by further phosphor-doping the phosphorus-doped polysilicon layer 9 by the ion implantation method or the like before performing chemical etching to the silicon-germanium mixed crystal layer 6. Accordingly, a state in which the phosphorus-doped polysilicon layer 9 is harder to etch than the silicon-germanium mixed crystal layer 6 is preset by sufficiently increasing etching selectivity in advance between the polysilicon layer 9, which is a phosphorus-doped silicon layer to which phosphorus is added, and the silicon-germanium mixed crystal layer 6, which is a phosphor-undoped silicon layer to which no phosphorus is added. In addition, when the silicon-germanium mixed crystal layer 6 is formed, the concentration of the germanium element therein is generally set to 10% or more. Etching selectivity between the silicon crystal layer 7 and the silicon crystal substrate 1, which are substantially wholly made of silicon crystals, and the silicon-germanium mixed crystal layer 6 in which silicon crystals and germanium crystals are mixed is thereby sufficiently increased in advance so that a state is set in which the silicon-germanium mixed crystal layer 6 is easier to etch than the silicon crystal layer 7 and the silicon crystal substrate 1.

Under the above settings, chemical etching by the above chemical solution is performed. Then, among the high-concentration phosphorus-doped polysilicon layer 9, the silicon oxide film 8, the silicon crystal layer 7, the silicon-germanium mixed crystal layer 6, and the silicon crystal substrate 1, only the silicon-germanium mixed crystal layer 6 can be removed by selective etching. Accordingly, as shown in FIGS. 4B and 4C, the cavity 11 can be formed at a location corresponding to the recess 3 formed previously inside the silicon crystal substrate 1. Moreover, as described above, each of the isolation trenches 10 is formed by adjusting the depth thereof so that sides of the silicon-germanium mixed crystal layer 6 are substantially completely exposed inside each of the isolation trenches 10. Accordingly, the silicon-germanium mixed crystal layer 6 can efficiently be removed from inside the silicon crystal substrate 1.

According to results verified by the inventors, almost no residues of the silicon-germanium mixed crystal layer 6 were observed inside the cavity 11 formed by the above process. By extension, it was found that characteristics fluctuations of each memory cell 21 described later can be controlled. Moreover, as shown in FIGS. 4A, 4B, and 4C, it was also found that the high-concentration phosphorus-doped polysilicon layer 9, the silicon oxide film 8, the silicon crystal layer 7, and the silicon crystal substrate 1 are hardly cut off at the time the chemical etching to the silicon-germanium mixed crystal layer 6 is finished.

Next, as shown in FIGS. 5A, 5B, and 5C, an insulating material 12 to be an embedded dielectric film is provided inside each of the isolation trenches 10 and the cavity 11. Here, the insulating material 12 is embedded inside the cavity 11 via each of the isolation trenches 10 using the coating method or the like. In parallel with this, the insulating material 12 is embedded inside each of the isolation trenches 10 until the upper surface of the insulating material 12 reaches an intermediate part of the high-concentration phosphorus-doped polysilicon layer 9. At this point, formation of incompletely embedded areas called voids inside each of the isolation trenches 10 and the cavity 11 can be avoided by applying an insulating coating film whose fluidity is high such as polysilazane to the inside of each of the isolation trenches 10 and the cavity 11 as the insulating material 12.

As shown in FIG. 5C, with the dielectric film 12 embedded inside each of the isolation trenches 10, the isolation region 13 for electrically isolating mutually adjacent memory cells 21 is formed on the surface layer part of the silicon crystal substrate 1 with a bottom end thereof extending deeper than the dielectric film 12 embedded inside the cavity 11. Moreover, as shown in FIG. 5B, with the dielectric film 12 embedded inside the cavity 11, the dielectric film 12 is partially provided at least at one location of the surface layer part of the silicon crystal substrate 1 while a silicon substrate 14 with the silicon crystal layer 7 provided on the dielectric film 12 is formed. That is, a so-called partial SOI substrate 14 is formed in which the SOI area 4 where the silicon crystal layer 7 is provided on the dielectric film 12 and the non-SOI area 5 where the dielectric film 12 is not provided coexist in one silicon substrate. Then, a portion of the silicon crystal layer 7 provided in the SOI area 4, that is, provided on the embedded dielectric film 12, is also called an SOI layer 7a.

Dielectric strength between the mutually adjacent memory cells 21 increases as the relative dielectric constant of the dielectric film 12 embedded inside each of the isolation trenches 10 decreases. Therefore, if, for example, polysilazane is used for embedding inside each of the isolation trenches 10 and the cavity 11, it is desirable to desorb or reduce impurities such as nitrogen, carbon, and hydrogen in a polysilazane film by performing steam oxidation to the polysilazane film after being applied. The dielectric film 12 embedded inside each of the isolation trenches 10 and the cavity 11 in the end can thereby be converted from the polysilazane film to a silicon oxide film with lower relative dielectric constant.

When forming each of the isolation trenches 10, crystal defects are likely to be caused in the surface layer part of the phosphorus-doped polysilicon layer 9, the silicon oxide film 8, the silicon crystal layer 7, the silicon-germanium mixed crystal layer 6, and the silicon crystal substrate 1 forming the inside of each of the isolation trenches 10. To rectify such crystal defects, it is preferable to perform thermal oxidation or radical oxidation to the surface layer part of the phosphorus-doped polysilicon layer (high-concentration phosphorus-doped polysilicon layer) 9, the silicon oxide film 8, the silicon crystal layer 7, the silicon-germanium mixed crystal layer 6, and the silicon crystal substrate 1 before or after the applied dielectric film 12 is embedded inside each of the isolation trenches 10 and the cavity 11. Further, instead of being configured by the above-described single applied dielectric film, the embedded dielectric film 12 may be configured by combining the applied dielectric film with a CVD dielectric film. Insulating properties of the embedded dielectric film 12 can thereby be further improved.

Figure 6A:
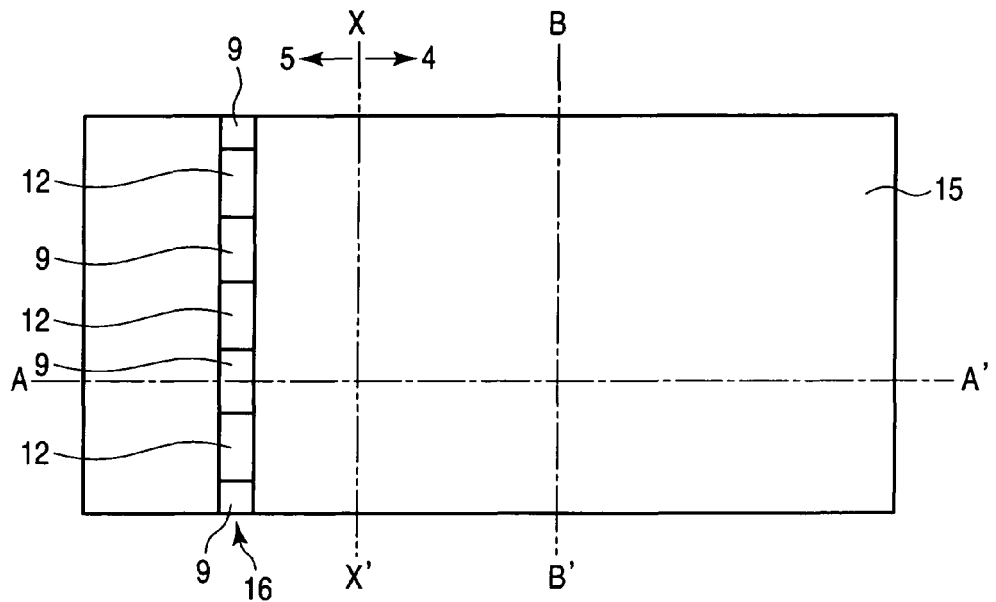
FIGS. 6A, 6B, and 6C are diagrams showing manufacturing processes of the nonvolatile semiconductor memory device according to the first embodiment.
Figure 6B:
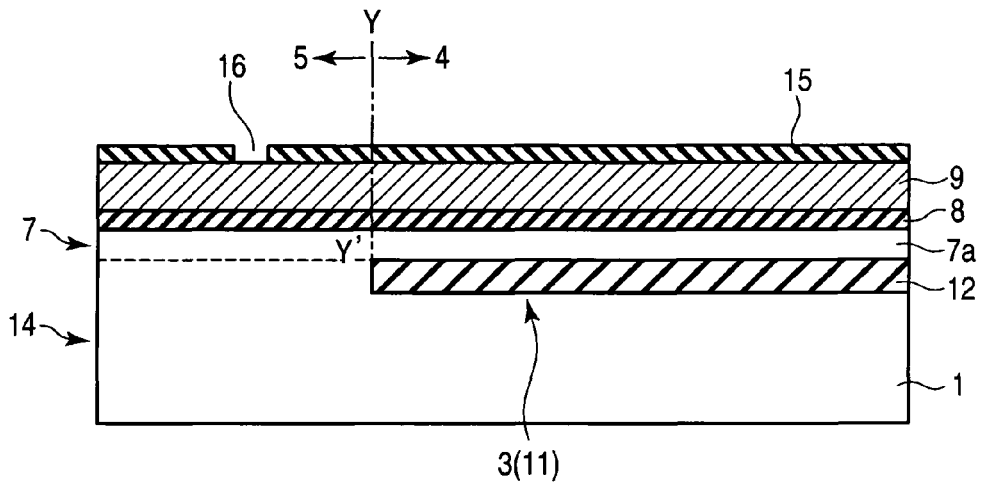
Figure 6C:
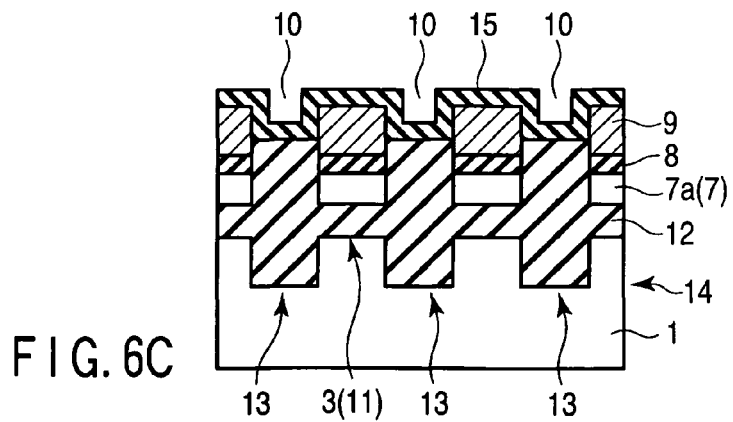

Next, as shown in FIGS. 6A, 6B, and 6C, a second dielectric film 15 to be an inter-electrode dielectric film is provided by covering the surface of the dielectric film 12 embedded inside each of the isolation trenches 10 and that of the high-concentration phosphorus-doped polysilicon layer 9. Here, the ALD (Atomic Layer Deposition) method or the like is used to cause an aluminum oxide film (alumina film) as the second dielectric film 15 to deposit overall on the surface of the embedded dielectric film 12 and the high-concentration phosphorus-doped polysilicon layer 9 until the thickness thereof reaches about 15 nm. Subsequently, though not shown, a resist film covering the surface of the alumina film 15 is provided and the resist film is patterned to a slit shape in accordance with a pattern of a select-gate transistor 22 described later. Subsequently, as shown in FIGS. 6A and 6B, a slit part 16 whose width is about 50 nm is formed by cutting off the alumina film 15 by the RIE method or the like using the patterned resist film as a mask to cause the alumina film 15 to cut through a formation planned area of the select-gate transistor. The surface of the embedded dielectric film 12 and that of the high-concentration phosphorus-doped polysilicon layer 9 are thereby partially exposed. After the slit part 16 is formed, the resist film on the alumina film 15 is removed to expose the surface of the alumina film 15.

Figure 7A:
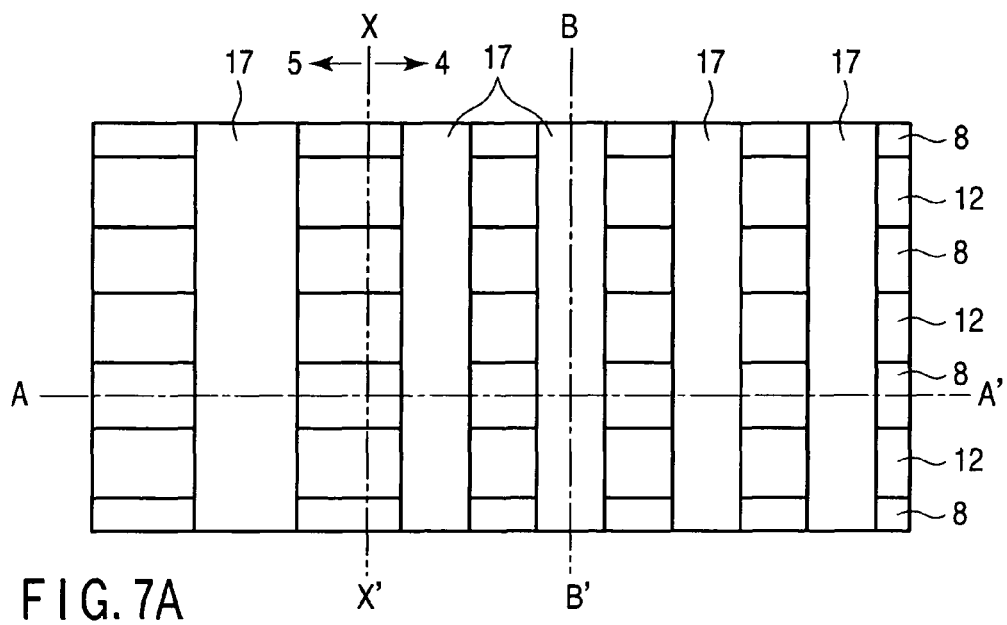
FIGS. 7A, 7B, and 7C are diagrams showing manufacturing processes of the nonvolatile semiconductor memory device according to the first embodiment.
Figure 7B:
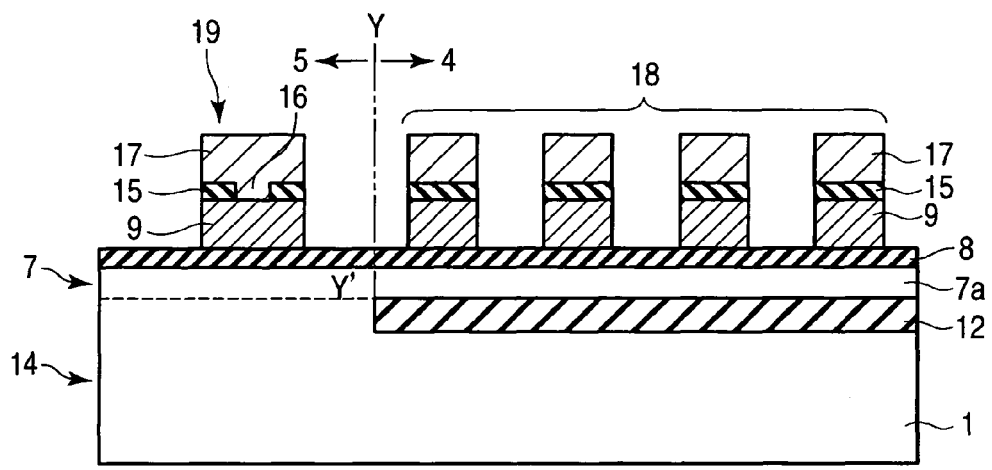
Figure 7C:
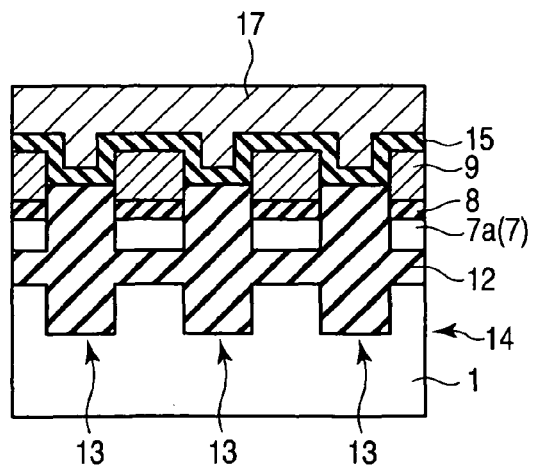

Next, as shown in FIGS. 7A, 7B, and 7C, a conductive layer 17 to be a control-gate electrode is provided by covering the surface of the alumina film 15 in which the slit part 16 is formed. Here, a tungsten silicide layer as a conductive layer 17 is caused to deposit on the surface of the alumina film 15 and also on the surface of the high-concentration phosphorus-doped polysilicon layer 9 exposed from the slit part 16 and that of the embedded dielectric film 12 using the sputtering process or the like. At this point, as shown in FIG. 7B, the tungsten silicide layer 17 and the high-concentration phosphorus-doped polysilicon layer 9 are electrically connected by the slit part 16. Subsequently, though not shown, a resist film covering the surface of the tungsten silicide layer 17 is provided and the resist film is patterned to a stripe shape in accordance with patterns of gate structures 18 and 19 of the memory cell 21 and the select-gate transistor 22 described later respectively. Subsequently, as shown in FIGS. 7A and 7B, the tungsten silicide layer 17, the alumina film 15, and the high-concentration phosphorus-doped polysilicon layer 9 are partially cut off and removed until the surface of the silicon oxide film 8 and that of the embedded dielectric film 12 are exposed by the RIE method or the like using the patterned resist film as a mask.

As a result, as shown in FIG. 7B, a plurality of stacked structures 18, in which the alumina film 15 to be an inter-electrode dielectric film is sandwiched by the tungsten silicide layer 17 to be a control-gate electrode and the high-concentration phosphorus-doped polysilicon layer 9 to be a floating-gate electrode, is left above the embedded dielectric film 12 on the surface of the silicon oxide film 8 to be a gate dielectric film (tunnel dielectric film). That is, the plurality of two-layer gate electrode structures 18 of the memory cell 21, in which two layers of the control-gate electrode 17 and the floating-gate electrode 9 are stacked, is formed in the SOI area 4 of the partial SOI substrate 14.

In addition, a stacked structure 19, in which the alumina film 15 is sandwiched by the tungsten silicide layer 17 and the high-concentration phosphorus-doped polysilicon layer 9, and the tungsten silicide layer 17 and the high-concentration phosphorus-doped polysilicon layer 9 are electrically connected via the slit part 16 of the alumina film 15, is left on the surface of the silicon oxide film 8 at a position deviating from above the embedded dielectric film 12. That is, the stacked gate electrode structure 19 of the select-gate transistor 22 having a gate electrode of a structure in which the tungsten silicide layer 17 is stacked on the high-concentration phosphorus-doped polysilicon layer 9 is formed in the non-SOI area 5 of the partial SOI substrate 14. After these electrode structures 18 and 19 are formed, the resist film is removed from the surface of the tungsten silicide layer 17. Incidentally, the tungsten silicide layer 17 functions as a word line.

Figure 8A:
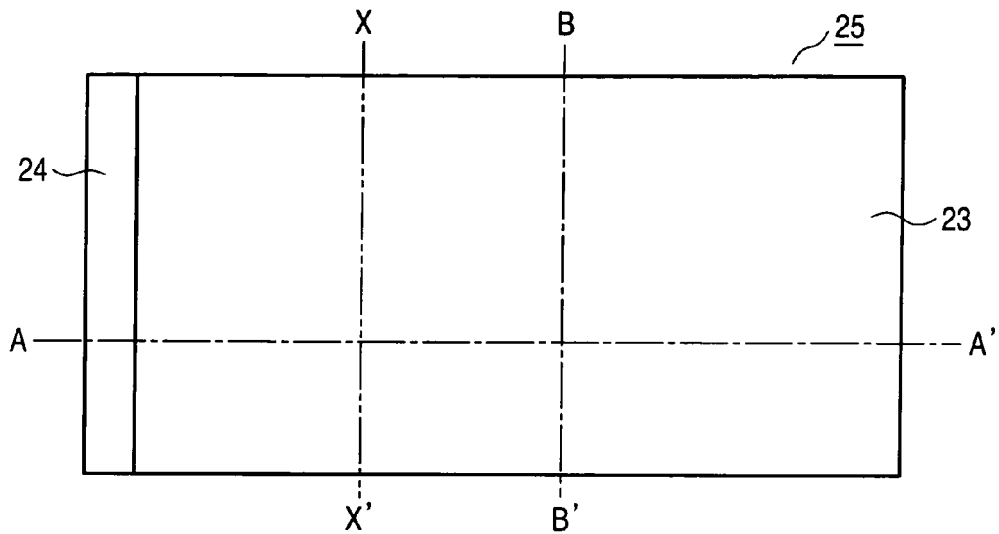
FIGS. 8A, 8B, and 8C are diagrams showing manufacturing processes of the nonvolatile semiconductor memory device according to the first embodiment.
Figure 8B:
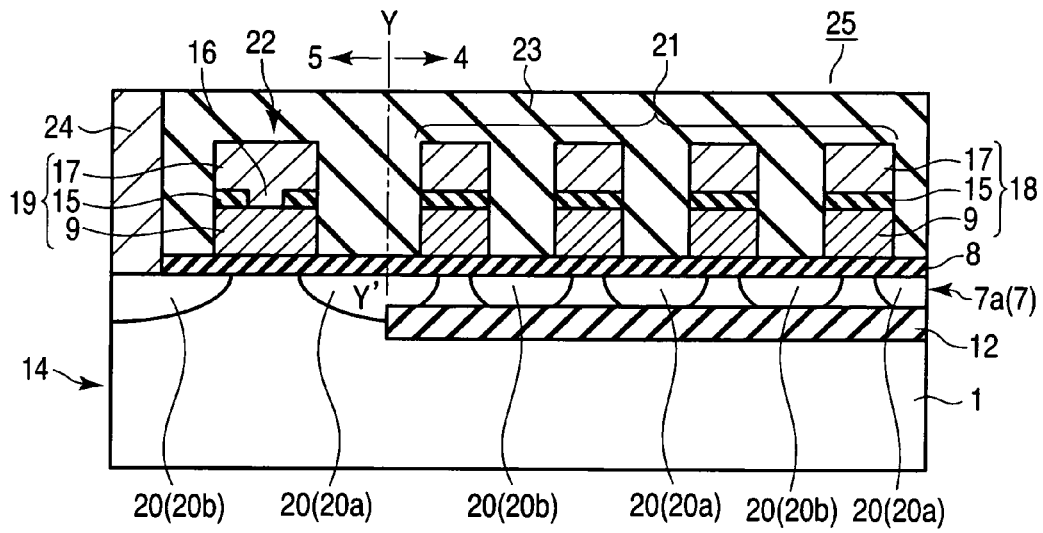

Next, as shown in FIG. 8B, impurity diffusion layers 20 are formed inside the silicon crystal layer 7 and the silicon crystal substrate 1. Here, n-type impurities are partially injected into the silicon crystal layer 7 and the silicon crystal substrate 1 for activation by performing the ion implantation method, thermal diffusion method and the like in combination using the two-layer gate electrode structure 18 and the stacked gate electrode structure 19 as masks. An n-type impurity diffusion layer 20 having a desired distribution of impurity concentrations, which is to be a source diffusion layer 20a and a drain diffusion layer 20b, is thereby formed at a plurality of locations inside the silicon crystal layer 7 above the embedded dielectric film 12 and in the surface layer part of the silicon crystal substrate 1 laterally from the embedded dielectric film 12. As shown in FIG. 8B, among these n-type impurity diffusion layers 20a and 20b, a portion of the bottom or bottom end of each of the source/drain diffusion layers 20a/20b formed in the SOI area 4 is provided by the upper surface of the embedded dielectric film 12. That is, the source/drain diffusion layers 20a/20b in the SOI area 4 are all formed inside the silicon crystal layer 7 on the upper side of the embedded dielectric film 12.

With the processes up to now, a plurality of floating-gate type transistors 21 as memory cells including the tunnel dielectric film 8, the two-layer gate electrode structure 18, and the source/drain diffusion layers 20a/20b is formed in the SOI area 4. In addition, the select-gate transistor 22 including the tunnel dielectric film 8, the stacked gate electrode structure 19, and the source/drain diffusion layers 20a/20b is formed in the non-SOI area 5. Thus, in the present embodiment, the SOI area 4 becomes a memory cell formation area (memory cell part). Each of the memory cells 21 is also called an SOI structure memory cell.

Figure 8C:
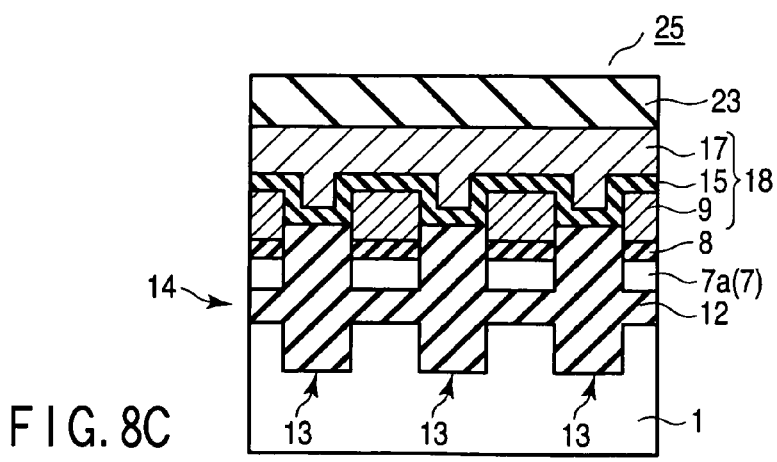

Next, as shown in FIGS. 8A, 8B, and 8C, an interlayer dielectric film 23 is provided using, for example, the CVD method by covering the tunnel dielectric film 8, the two-layer gate electrode structure 18, and the stacked gate electrode structure 19. Subsequently, though not shown, the interlayer dielectric film 23 and the tunnel dielectric film 8, above the impurity diffusion layer 20b formed in the non-SOI area 5 of the impurity diffusion layers 20a and 20b held by the select-gate transistor 22, are dug deeply using etching technology or the like until the surface of the impurity diffusion layer 20b is exposed to form an opening. Subsequently, a conductive material such as tungsten is embedded inside the opening using a publicly known method to form a bit line contact plug 24. Moreover, though not shown, a source line contact plug is formed on the SOI substrate 14 using a similar process. Then, a NAND-type flash memory 25 as a nonvolatile semiconductor memory device according to the present embodiment having a structure shown in FIGS. 8A, 8B, and 8C is completed by undergoing a wire formation process of bit lines and the like (not shown). While a select-gate transistor is provided on both sides of a plurality of memory cells in a common NAND-type flash memory, the select-gate transistor part is shown, for the sake of convenience, only on one side of each memory cell in drawings of the application concerned.

In the above flash memory 25, the source/drain diffusion layers 20a/20b of the mutually adjacent memory cells 21 are each separated, but the present invention is not limited to this. For example, the source/drain diffusion layers 20a/20b of the memory cells 21 may be integrally connected. A method of forming a structure in which the source/drain diffusion layers of the memory cells are integrally connected will briefly be described below.

Figure 9A:
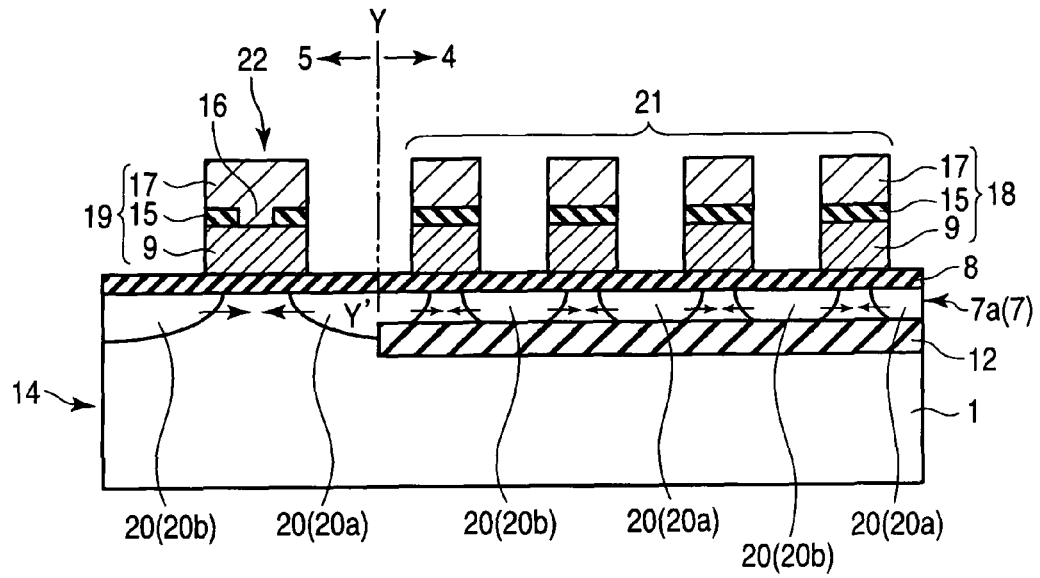
FIGS. 9A and 9B are sectional views showing manufacturing processes of a modification of the nonvolatile semiconductor memory device according to the first embodiment.
Figure 9B:
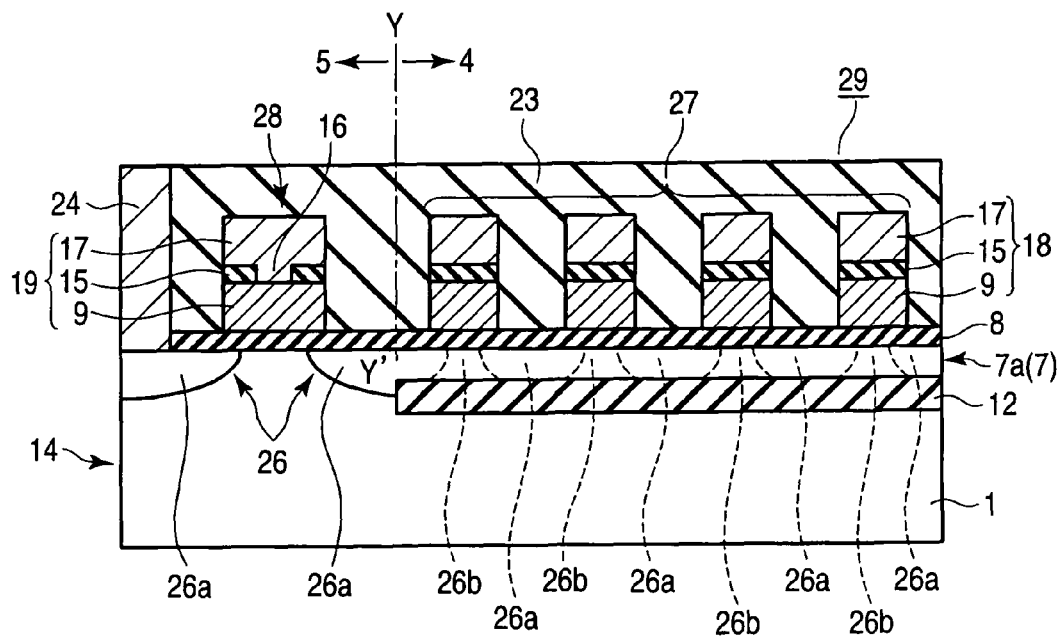

First, as shown in FIG. 9A, a plurality of the memory cells 21 and the select-gate transistor 22 are formed previously by the processes described with reference to FIGS. 1A, 1B, and 1C to FIGS. 8A, 8B, and 8C. Subsequently, thermal diffusion is further performed to the surface layer part of the partial SOI substrate 14 before the interlayer dielectric film 23 is provided on the partial SOI substrate 14. As shown by solid line arrows in FIG. 9A, impurities are caused to diffuse from each of the source/drain diffusion layers 20a/20b mainly toward areas of the silicon crystal layer 7 where impurities are not injected to thereby substantially integrate the mutually adjacent source/drain diffusion layers 20a/20b. As a result, as shown in FIG. 9B, an n-type impurity diffusion layer 26 is formed completely inside the silicon crystal layer 7 above the embedded dielectric film 12. At this point, areas in the n-type impurity diffusion layer 26 corresponding to the source/drain diffusion layers 20a/20b become denser areas (high-concentration impurity diffusion areas) 26a in impurity concentrations and those not corresponding to the source/drain diffusion layers 20a/20b become thinner areas (low-concentration impurity diffusion areas) 26b in impurity concentrations. In this case, memory cells function as the depression-type transistor (D-type transistor).

A plurality of floating-gate type transistors 27 as memory cells having the tunnel dielectric film 8 and the two-layer gate electrode structure 18 and sharing the n-type impurity diffusion layer 26 is formed in the SOI area 4 by the processes up to now. In addition, a select-gate transistor 28 including the tunnel dielectric film 8, the stacked gate electrode structure 19, and the n-type impurity diffusion layer 26 is formed in the non-SOI area 5. Then, as described previously with reference to FIGS. 8A, 8B, and 8C, the interlayer dielectric film 23, the bit line contact plug 24 and the like are formed on the partial SOI substrate 14. A NAND-type flash memory 29, which is a modification of the above-described NAND-type flash memory 25 and has the structure shown in FIG. 9B, is thereby completed.

In the first embodiment, as described above, the silicon crystal layer 7 of which the memory cells 21 and 27 and the select-gate transistors 22 and 28 are formed is formed by epitaxial growth in the longitudinal direction (film thickness direction). Thus, the silicon crystal layer 7 has excellent crystallizability in which almost no crystal defects or the like is observed. Particularly, by applying the above processes, the SOI layer 7a containing almost no crystal defects can be formed on the surface of not only the silicon crystal substrate 1, but also the silicon-germanium mixed crystal layer 6. According to such a structure, an off current attempting to flow in the SOI layer 7a in a direction along the surface thereof (transverse direction) in an "off-state" in which the bias is set so that no channel current flows into the memory cells 21 and 27 can be reduced even when the memory cells 21 and 27 are made still finer to achieve higher integration. That is, the on/off ratio of the channel current can be improved. As a result, malfunctioning of the memory cells 21 and 27 made still finer can be made less likely to occur by improving controllability of the memory cells 21 and 27 by the gate voltage. By extension, malfunctioning of the entire NAND-type flash memories 25 and 29 will be avoidable.

Moreover, in the first embodiment, as described above, the select-gate transistors 22 and 28 are provided in the non-SOI area 5, not in the SOI area 4. In the non-SOI area 5, the silicon crystal layer 7 is formed by epitaxial growth directly on the surface of the silicon crystal substrate 1 serving as a substrate in the longitudinal direction. Thus, the silicon crystal layer 7 in the non-SOI area 5 is more excellent in crystallizability than the SOI layer 7a, which is the silicon crystal layer 7 in the SOI area 4. According to such a structure, the possibility of a junction leakage current in the select-gate transistors 22 and 28 can sufficiently be reduced even when the select-gate transistors 22 and 28 are made still finer to achieve higher integration. As a result, malfunctioning of the entire NAND-type flash memories 25 and 29 will be avoidable in various operations including reading data.

Further, in the first embodiment, the silicon-germanium mixed crystal layer 6 is made relatively easier to etch than the high-concentration phosphorus-doped polysilicon layer 9, the silicon oxide film 8, the silicon crystal layer 7, and the silicon crystal substrate 1 in advance before performing etching to the silicon-germanium mixed crystal layer 6. In addition, sides of the silicon-germanium mixed crystal layer 6 are substantially completely exposed inside each of the isolation trenches 10. According to such a method, the silicon-germanium mixed crystal layer 6 can efficiently and selectively be removed from inside the silicon crystal substrate 1 without leaving almost no residue of the silicon-germanium mixed crystal layer 6 inside the cavity 11. As a result, characteristics fluctuations of the memory cells 21 and 27 formed above the dielectric film 12 embedded inside the cavity 11 can be reduced.

Therefore, according to the first embodiment, higher integration and miniaturization of the NAND-type flash memories 25 and 29 can be achieved by making the memory cells 21 and 27 and the select-gate transistors 22 and 28 finer to achieve higher integration. In addition, reliability, performance, and quality of the memory cells 21 and 27 and the select-gate transistors 22 and 28 made finer and for which higher integration is achieved can be improved. By extension, reliability, performance, and quality of the NAND-type flash memories 25 and 29 made finer and for which higher integration is achieved can be improved. Moreover, yields and manufacturing efficiency can be increased by reducing the rate of occurrence of defective products of the NAND-type flash memories 25 and 29.

Second Embodiment

Next, a second embodiment according to the present invention will be described with reference to FIGS. 10A to 11B. The same reference numbers are attached to the same components as those in the first embodiment described above and a detailed description thereof is omitted. The present embodiment is essentially different only in the structure of the non-SOI area of a nonvolatile semiconductor memory device from that of the first embodiment and otherwise is substantially the same as the first embodiment.

Figure 10A:
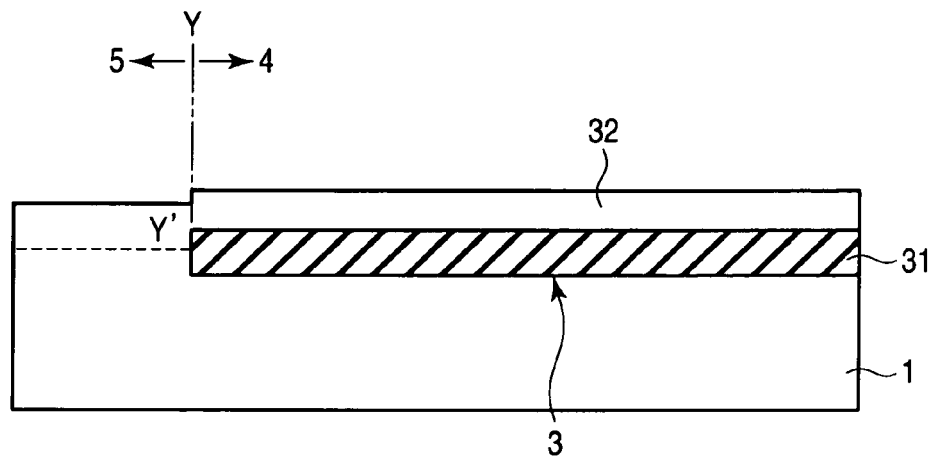
FIGS. 10A and 10B are sectional views showing manufacturing processes of a nonvolatile semiconductor memory device according to a second embodiment.

First, as shown in FIG. 10A, a silicon-germanium mixed crystal layer 31 and a silicon crystal layer 32 are formed on the silicon crystal substrate 1. In the present embodiment, however, the time taken for epitaxial growth of the silicon-germanium mixed crystal layer 31 is made longer than that taken for epitaxial growth of the silicon-germanium mixed crystal layer 6 in the first embodiment. That is, in contrast to the first embodiment, the silicon-germanium mixed crystal layer 31 is epitaxially grown in the present embodiment until the thickness thereof becomes thicker than the depth of the recess (etching retreat part) 3 formed in the silicon crystal substrate 1. Accordingly, the silicon-germanium mixed crystal layer 31 whose surface is higher than that of the silicon crystal substrate 1 and has a shape projecting from the recess 3 is formed.

Then, the silicon crystal layer 32 is epitaxially grown in the longitudinal direction by covering the surface of the silicon crystal substrate 1 and that of the silicon-germanium mixed crystal layer 31 so that the thickness thereof is substantially equal on the surface of the silicon crystal substrate 1 and on the surface of the silicon-germanium mixed crystal layer 31. The silicon crystal layer 32 whose surface in the SOI area 4 is higher than that in the non-SOI area 5 and having a step part in a boundary part between the SOI area 4 and the non-SOI area 5 is thereby formed.

Figure 10B:
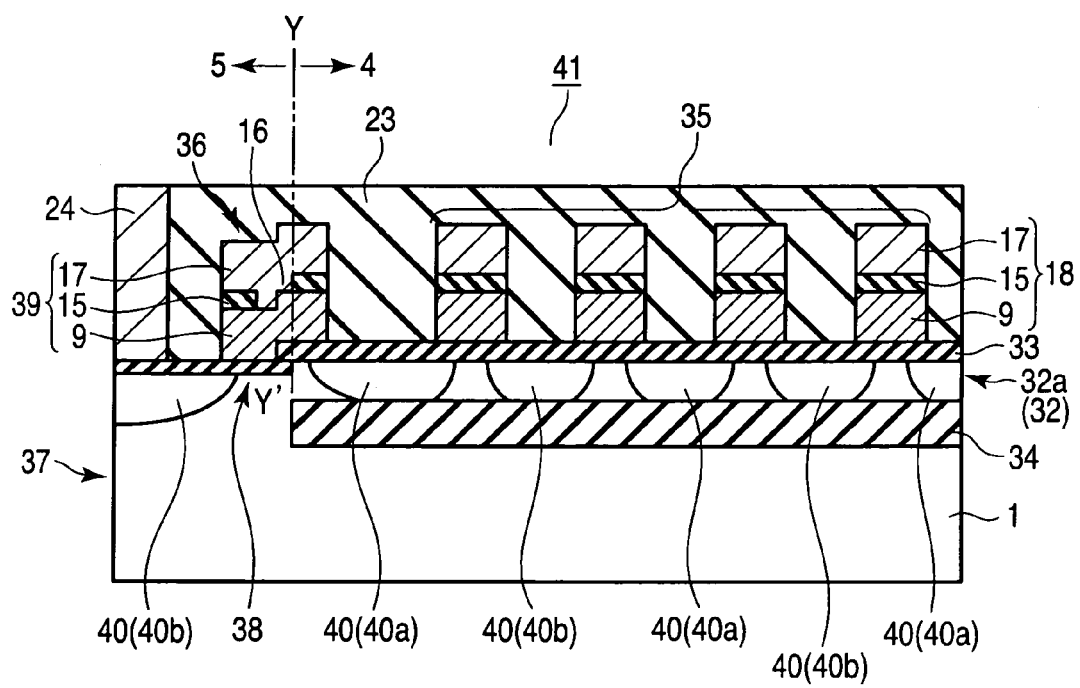

Next, as shown in FIG. 10B, a gate dielectric film (silicon oxide film) 33, an embedded dielectric film 34, a plurality of memory cells 35, a select-gate transistor 36, the interlayer dielectric film 23, the bit line contact plug 24 and the like are formed. The gate dielectric film 33 has, like the silicon crystal layer 32 serving as a substrate thereof, the thickness substantially equal in the SOI area 4 and the non-SOI area 5, the surface higher in the SOI area 4 than in the non-SOI area 5, and a step part in the boundary part between the SOI area 4 and the non-SOI area 5. Moreover, with an embedded dielectric film 34 thicker than the embedded dielectric film 12 in the first embodiment formed between the silicon crystal substrate 1 and the silicon crystal layer 32, a partial SOI substrate 37 in the present embodiment whose surface in the SOI area 4 is higher than that in the non-SOI area 5 and having a step part in the boundary part between the SOI area 4 and the non-SOI area 5 is formed.

In contrast to the first embodiment, as shown in FIG. 10B, the select-gate transistor 36 is formed in the present embodiment extending over a step part 38 formed in the boundary part between the SOI area 4 and the non-SOI area 5 of the partial SOI substrate 37. Thus, a stacked gate electrode structure 39 of the select-gate transistor 36 is formed in a double-level structure in which the SOI area 4 side is higher than the non-SOI area 5 side. In addition, a plurality of impurity diffusion layers 40 to be a source diffusion layer 40a or a drain diffusion layer 40b of each of the memory cells 35 is all formed inside an SOI layer 32a on the embedded dielectric film 34 including the impurity diffusion layer 40 formed between the select-gate transistor 36 and the memory cell 35 adjacent thereto and closest to the non-SOI area 5. That is, bottoms of all the source/drain diffusion layers 40a/40b of the memory cells 35 are provided by the upper surface of the embedded dielectric film 34. The impurity diffusion layer 40b of the two impurity diffusion layers 40 held by the select-gate transistor 36 to which the bit line contact plug 24 is connected is formed, like the impurity diffusion layer 20b to which the bit line contact plug 24 held by the select-gate transistor 22 in the first embodiment is connected, in the non-SOI area 5.

Then, like the first embodiment, a NAND-type flash memory 41 according to the present embodiment having the structure shown in FIG. 10B is completed by undergoing the wire formation process of bit lines and the like (not shown). In the NAND-type flash memory 41, as described above, the stacked gate electrode structure 39 of the select-gate transistor 36 is formed in a double-level structure extending over the step part 38 formed in the boundary part between the SOI area 4 and the non-SOI area 5. That is, in contrast to the stacked gate electrode structure 19 of the select-gate transistors 22 and 28 in the first embodiment whose bottom is formed in a plane shape, the stacked gate electrode structure 39 in the present embodiment is formed to have a bottom in an oblique or step shape. According to such a structure, even if the width of the stacked gate electrode structure 39 along the channel length direction of the select-gate transistor 36 is set to be equal to that of the stacked gate electrode structure 19 along the channel length direction of the select-gate transistors 22 and 28, the length of the bottom of the stacked gate electrode structure 39 along the channel length direction is substantially extended compared with the length of the bottom of the stacked gate electrode structure 19 along the channel length direction.

Therefore, in the NAND-type flash memory 41, the channel length of the select-gate transistor 36 can substantially be extended without increasing the width of the stacked gate electrode structure 39 along the channel length direction of the select-gate transistor 36 or broadening the interval between the source diffusion layer 40a and the drain diffusion layer 40b of the select-gate transistor 36. Accordingly, malfunctioning of the select-gate transistor 36 will be avoidable by adequately controlling the short channel effect even if the select-gate transistor 36 is made finer.

Figure 11A:
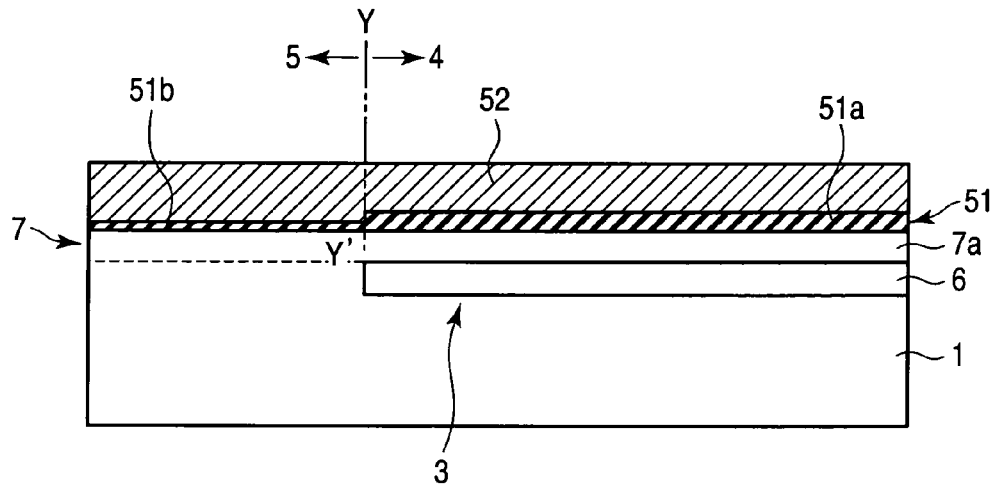
FIGS. 11A and 11B are sectional views showing manufacturing processes of a modification of the nonvolatile semiconductor memory device according to the second embodiment.

Next, a modification of the present invention will be described. First, as shown in FIG. 11A, the embedded spacer layer 6 and the silicon crystal layer 7 are formed on the silicon crystal substrate 1. Subsequently, a gate dielectric film (silicon oxide film) 51 is formed on the silicon crystal layer 7. In contrast to the first embodiment, however, the gate dielectric film 51 is formed in the present embodiment whose thickness in the non-SOI area 5 is thinner than that in the SOI area 4. Two methods described below are known as methods to form the gate dielectric film 51 partially having a different thickness.

First, the first method is a method in which the lattice constant of the embedded spacer layer 6 in the silicon crystal substrate 1 is made larger than that of silicon crystal. By making the lattice constant of the embedded spacer layer 6 larger than that of the silicon crystal, a tensile stress is given to the surface layer part of the silicon crystal layer 7a on the embedded spacer layer 6 to be an SOI layer of the silicon crystal layer 7 formed on the silicon crystal substrate 1 and the embedded spacer layer 6. This makes the oxidation rate on the surface of the silicon crystal layer 7a on the embedded spacer layer 6 faster than that on the surface of the silicon crystal layer 7 in an area where the embedded spacer layer 6 is not provided. That is, the film formation rate of the silicon oxide film 51 on the surface of the silicon crystal layer 7a on the embedded spacer layer 6 is made faster than that on the surface of the silicon crystal layer 7 in an area where the embedded spacer layer 6 is not provided. As a result, the silicon oxide film 51 whose thickness in the non-SOI area 5 is thinner than that in the SOI area 4 and having a step part in the boundary part between the SOI area 4 and the non-SOI area 5 can easily be formed in one process without a need to form the silicon oxide film 51 in the SOI area 4 and the non-SOI area 5 separately.

The above silicon-germanium mixed crystal layer has a lattice constant larger than that of the silicon crystal. Therefore, the first method described above can easily be performed by using a silicon-germanium mixed crystal layer as the embedded spacer layer 6. Particularly, by increasing the germanium concentration in the silicon-germanium mixed crystal layer, a larger tensile stress is given to the surface layer part of the silicon crystal layer 7a to make the film formation rate of the silicon oxide film 51 on the surface of the silicon crystal layer 7a faster.

Next, the second method is a method in which the silicon oxide film 51 is formed using the thermal oxidation method by photoirradiation heating. In the second method, the wavelength of irradiation light when the thermal oxidation method by photoirradiation heating is applied is set to a magnitude comparable to a thickness of the silicon crystal layer 7a of the silicon-germanium mixed crystal layer 6 or several times thereof. Alternatively, a material whose rate of heat absorption is higher than that of the silicon crystal as an embedded spacer layer is used. The rate of optical absorption in the SOI area 4 is thereby increased to make the film formation rate of the silicon oxide film 51 in the SOI area 4 faster than that in the non-SOI area 5. As a result, like the first method described above, the silicon oxide film 51 whose thickness in the non-SOI area 5 is thinner than that in the SOI area 4 and having a step part in the boundary part between the SOI area 4 and the non-SOI area 5 can easily be formed in one process without a need to form the silicon oxide film 51 in the SOI area 4 and the non-SOI area 5 separately.

Subsequently, as shown in FIG. 11A, a phosphorus-doped polysilicon layer to be a charge storage layer 52 is formed on the surface of the gate dielectric film 51 consisting of a thick part 51a and a thin part 51b. At this point, the phosphorus-doped polysilicon layer 52 whose surface height is unchanged between the SOI area 4 and the non-SOI area 5 is formed by complementing (making up) a difference in film thickness between the thick part 51a and the thin part 51b of the silicon oxide film 51 serving as a substrate.

Figure 11B:
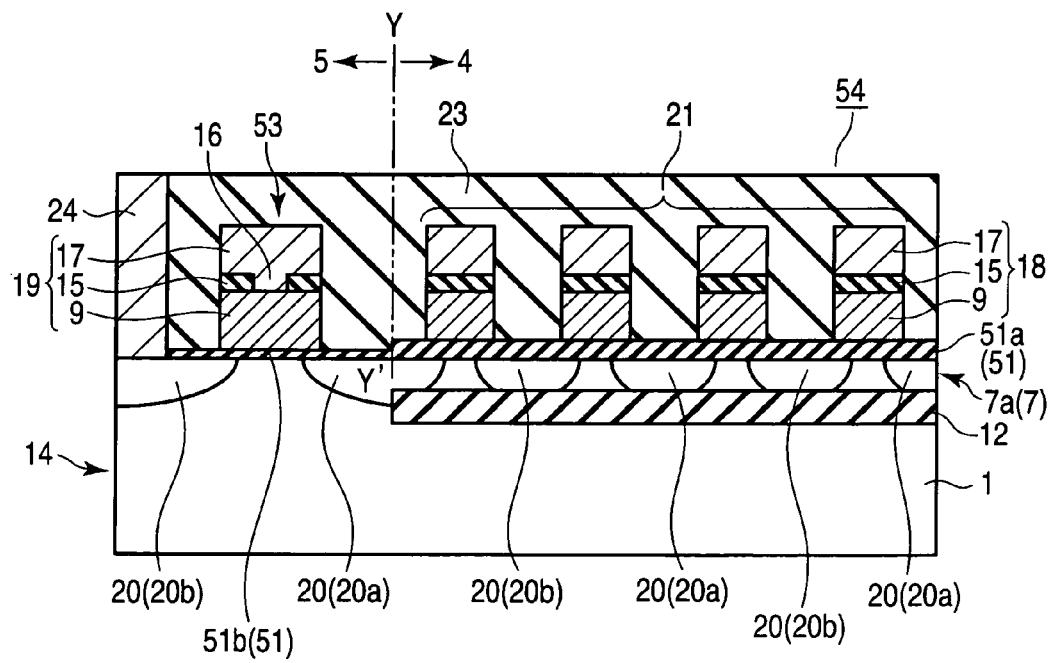

Next, as shown in FIG. 11B, the embedded dielectric film 12, a plurality of the memory cells 21, a select-gate transistor 53, the interlayer dielectric film 23, the bit line contact plug 24 and the like are formed. Then, like in the first embodiment, a NAND-type flash memory 54, which is a modification of the NAND-type flash memory 41 described above, having the structure shown in FIG. 11B is completed by undergoing the wire formation process of bit lines and the like (not shown). In the NAND-type flash memory 54, as described above, the gate dielectric film 51b of the select-gate transistor 53 is formed thinner than the gate dielectric film 51a of the memory cells 21. According to such a structure, a high-speed operation is enabled by increasing driving force of the select-gate transistor 53 while ensuring reliability of each of the memory cells 21. Also, according to a method of manufacturing the NAND-type flash memory 54 described above, the memory cells 21 whose reliability is improved and the select-gate transistor 53 whose operation is speeded up can be formed in substantially the same process without a need to form the memory cells 21 and the select-gate transistor 53 separately.

According to the second embodiment, as described above, effects similar to those in the first embodiment described above can be obtained. In addition, while ensuring reliability of each of the memory cells 21 and 35, it becomes possible to further improve operational accuracy of the select-gate transistors 36 and 53 or to further increase the operational speed of the select-gate transistors 36 and 53.

Third Embodiment

Next, a third embodiment according to the present invention will be described with reference to FIGS. 12A to 18B. The same reference numbers are attached to the same components as those in the first and second embodiments described above and a detailed description thereof is omitted. In the present embodiment, an SOI layer for which sufficient mechanical strength is secured and having excellent crystallizability even if the SOI layer is extended widely in the transverse direction such as when many memory cells are aligned along the bit line direction, and the formation method thereof will be described. Also, a nonvolatile semiconductor memory device in which a plurality of SOI structure memory cells is provided on such an SOI layer and a manufacturing method thereof will be described. Further, in contrast to the first and second embodiments, a memory cell is configured in the present embodiment by using a so-called MONOS-type transistor, instead of the floating-gate type transistor.

Figure 12A:
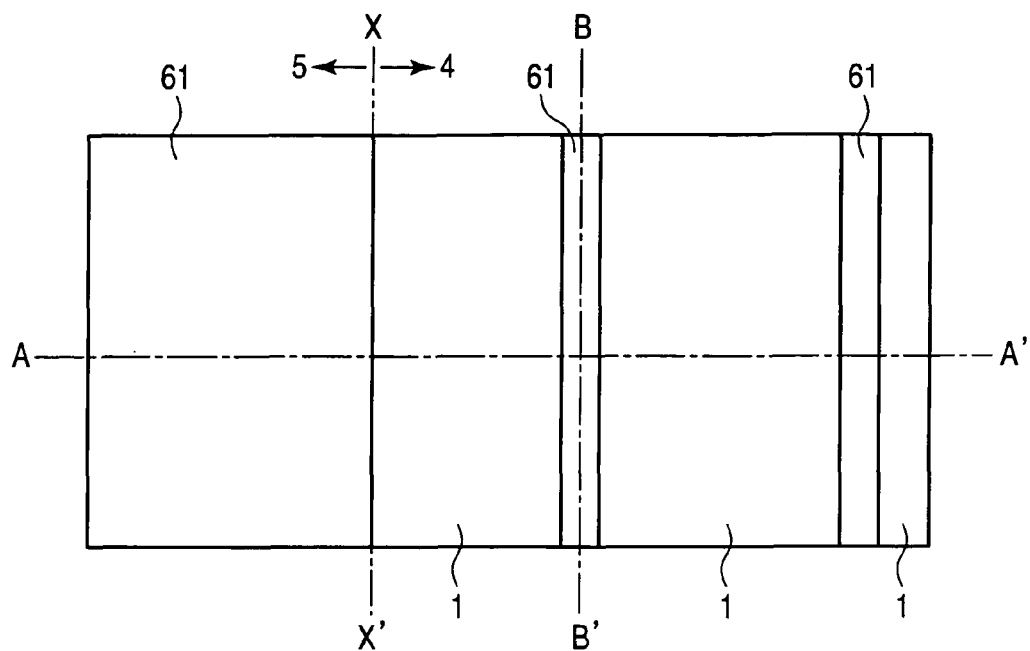
FIGS. 12A, 12B, and 12C are diagrams showing manufacturing processes of a nonvolatile semiconductor memory device according to a third embodiment.
Figure 12B:
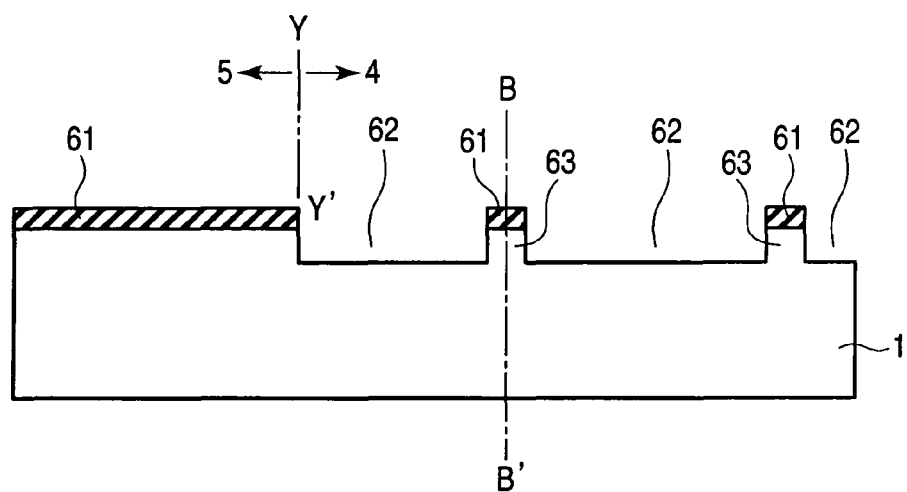
Figure 12C:
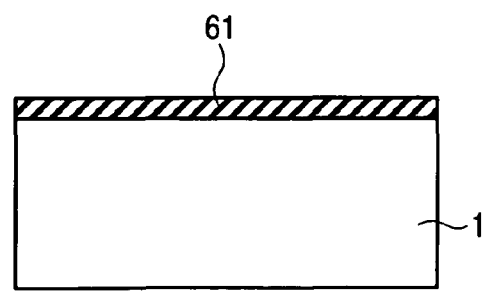

First, as shown in FIGS. 12A, 12B, and 12C, a silicon oxide film 61 is provided by covering the surface of the p-type silicon crystal substrate 1. Subsequently, though not shown, a resist film is provided by covering the surface of the silicon oxide film 61 and then, the resist film is patterned. In contrast to the first and second embodiments, a pattern in a stripe shape whose width is, for example, about 20 nm is left in the SOI area 4 at intervals of about 200 nm in the present embodiment and also the resist film covering the non-SOI area 5 is patterned. Subsequently, the silicon oxide film 61 is partially removed by using the patterned resist film as a mask to make a portion of the surface of the silicon crystal substrate 1 in the SOI area 4 exposed. Accordingly, as shown in FIGS. 12A and 12B, the silicon oxide film 61 in the stripe shape whose width is about 20 nm is left in the SOI area 4 at intervals of about 200 nm on the surface of the silicon crystal substrate 1 and also the silicon oxide film 61 is left in the non-SOI area 5 by covering the surface of the silicon crystal substrate 1. Then, the resist film is removed from the surface of the silicon crystal substrate 1.

Subsequently, an exposure area of the silicon crystal substrate 1 exposed from the silicon oxide film 61 is caused to retreat from the surface of the silicon crystal substrate 1 by about 50 nm by etching according to the RIE method. A recess 62 consisting of an exposure area of silicon crystal measuring about 200 nm in width and about 50 nm in depth is thereby formed at a plurality of locations in the surface layer part of the SOI area 4 after the surface of the silicon crystal substrate 1 is partially dug. In addition, one height 63 in the stripe shape made of silicon crystals and having a height of about 50 nm is formed between the mutually adjacent recesses 62. The interval between the heights 63 is about 200 nm and the width of each of the heights 63 is about 20 nm.

Figure 13A:
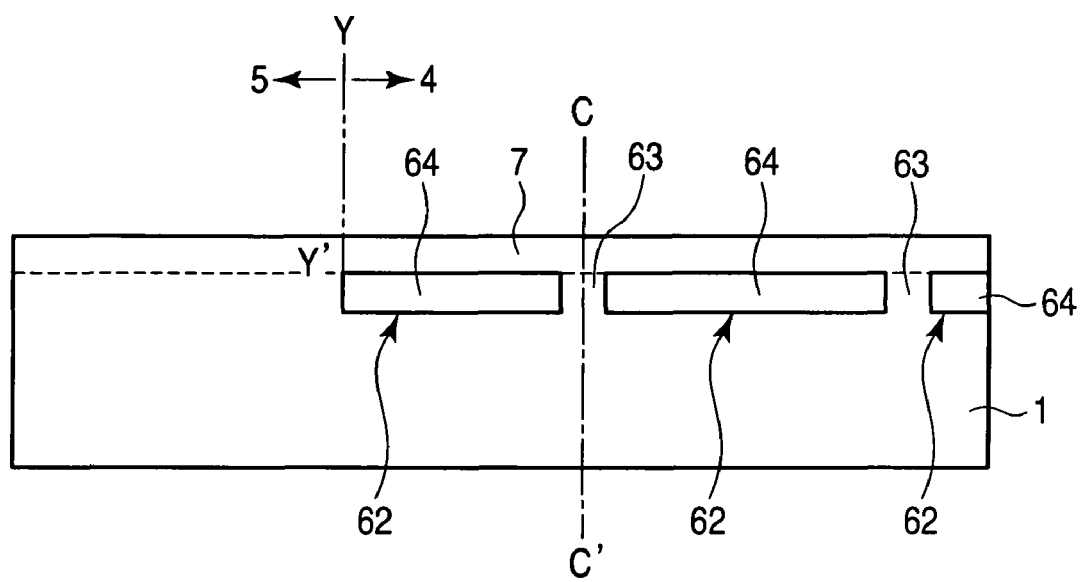
FIGS. 13A and 13B are sectional views showing manufacturing processes of the nonvolatile semiconductor memory device according to the third embodiment.
Figure 13B:
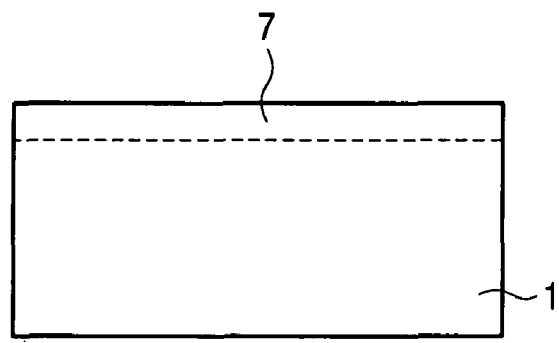

Next, as shown in FIG. 13A, a silicon-germanium mixed crystal layer 64 to be an embedded spacer layer whose thickness is about 50 nm is selectively formed inside each of the recesses 62 by the epitaxial growth method. A material gas containing dichlorsilane and germane is used for the formation and the flow rate of the material gas is controlled so that the composition ratio of the silicon and germanium elements contained in the material gas becomes about 10:1 to 3:1. After the silicon-germanium mixed crystal layer 64 is embedded in each of the recesses 62, the silicon oxide film 2 left on the silicon crystal substrate 1 is removed to expose the surface of the silicon crystal substrate 1. Subsequently, as shown in FIGS. 13A and 13B, the silicon crystal layer 7 whose thickness is about 50 nm is formed on the surface of the silicon crystal substrate 1 and that of the silicon-germanium mixed crystal layer 64 by the epitaxial growth method.

FIG. 13A is a sectional view showing a nonvolatile semiconductor memory device according to the present embodiment along the channel length direction (bit line direction). FIG. 13B is a sectional view showing along a break line C-C' in FIG. 13A. More specifically, FIG. 13B is a sectional view showing the nonvolatile semiconductor memory device according to the present embodiment along the channel width direction (word line direction). Such relationships between FIGS. 13A and 13B also apply to FIGS. 14A and 14B to FIGS. 21A and 21B, FIGS. 23A and 23B to FIGS. 27A and 27B, and FIGS. 30A and 30B to FIGS. 32A and 32B to be referenced later.

Figure 14A:
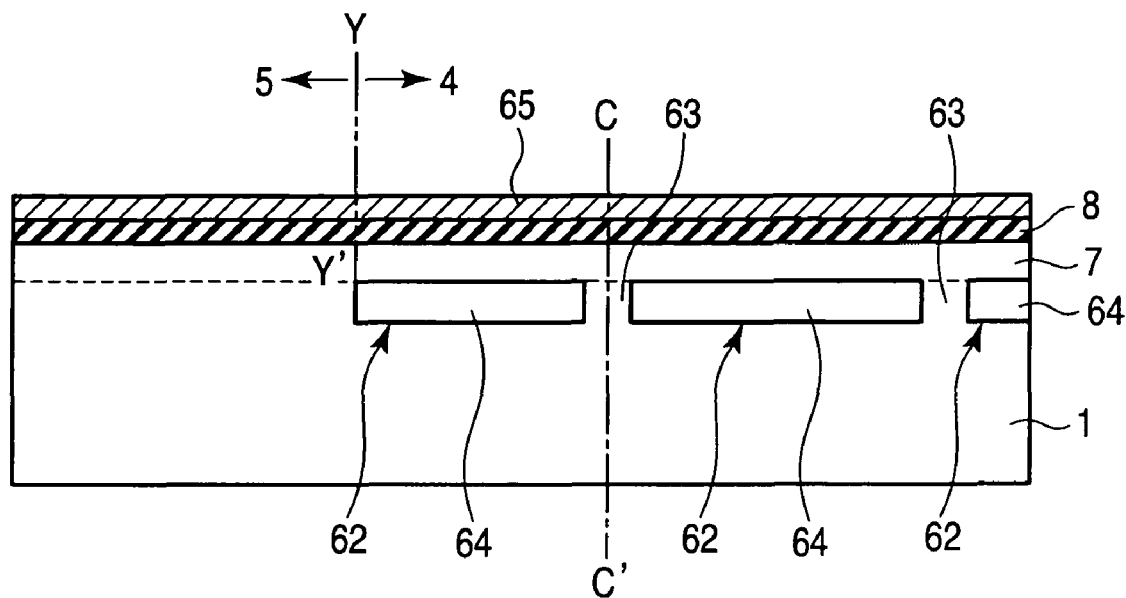
FIGS. 14A and 14B are sectional views showing manufacturing processes of the nonvolatile semiconductor memory device according to the third embodiment.
Figure 14B:
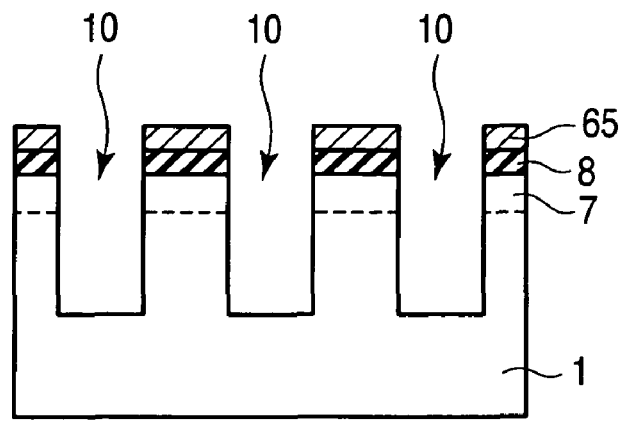

Next, as shown in FIGS. 14A and 14B, the silicon oxide film 8 whose thickness is about 4 nm is formed completely on the surface of the silicon crystal layer 7 by the thermal oxidation method. Subsequently, a charge storage layer 65 is formed on the surface of the silicon oxide film 8. In contrast to the first and second embodiments, the charge storage layer 65 is formed in the present embodiment by using a silicon nitride film, instead of the phosphorus-doped polysilicon layer 9. Here, the silicon nitride film 65 whose thickness is about 5 nm is caused to deposit completely on the surface of the silicon oxide film 8 by the CVD method.

Subsequently, the silicon nitride film 65, the silicon oxide film 8, the silicon crystal layer 7, the silicon-germanium mixed crystal layer 6, and the silicon crystal substrate 1 are partially cut off and removed by the RIE method using a resist film (not shown) patterned in the stripe shape in accordance with the pattern of the isolation region 13 as a mask. Accordingly, a plurality of the isolation trenches 10 whose bottom reaches the inside of the silicon crystal substrate 1 below the silicon-germanium mixed crystal layer 6 is formed in the SOI area 4 while sides of the silicon-germanium mixed crystal layer 6 are made substantially completely exposed inside each of the isolation trenches 10. The resist film is removed after each of the isolation trenches 10 is formed. Also in the present embodiment, like in the first embodiment, each of the isolation trenches 10 is formed by cutting through the silicon-germanium mixed crystal layer 6 and the structure thereof does not appear in the sectional view shown in FIG. 14B.

Next, as shown in FIG. 15A, chemical etching of the silicon-germanium mixed crystal layer 6 is performed via each of the isolation trenches 10 to selectively remove the silicon-germanium mixed crystal layer 6 from inside the silicon crystal substrate 1. A cavity 66 is thereby formed at a location corresponding to each of the recesses 62 inside the silicon crystal substrate 1. Like in the first embodiment, the silicon nitride film 65, the silicon crystal layer 7, and the silicon crystal substrate 1 are treated in advance to make them more difficult to etch compared with the silicon-germanium mixed crystal layer 6 before performing chemical etching to the silicon-germanium mixed crystal layer 6. Also in the present embodiment, like in the first embodiment, each of the cavities 66 is formed by communicatively connecting to each of the isolation trenches 10, but the structure thereof does not appear in the sectional view shown in FIG. 15B.

As described above, the height 63 made of silicon crystals and having a stripe shape is formed between the cavities 66. Thus, even if the silicon-germanium mixed crystal layer 6 is removed from inside the silicon crystal substrate 1, there is almost no possibility that a stacked structure consisting of the silicon crystal layer 7, the silicon oxide film 8, and the silicon nitride film 65 formed above each of the cavities 66 receives a large mechanical stress. Therefore, there is almost no possibility that the stacked structure above each of the cavities 66 is bent or broken even if the number of the cavities 66 is increased by lengthening the SOI area 4 in the direction along the surface thereof.

Figure 16A:
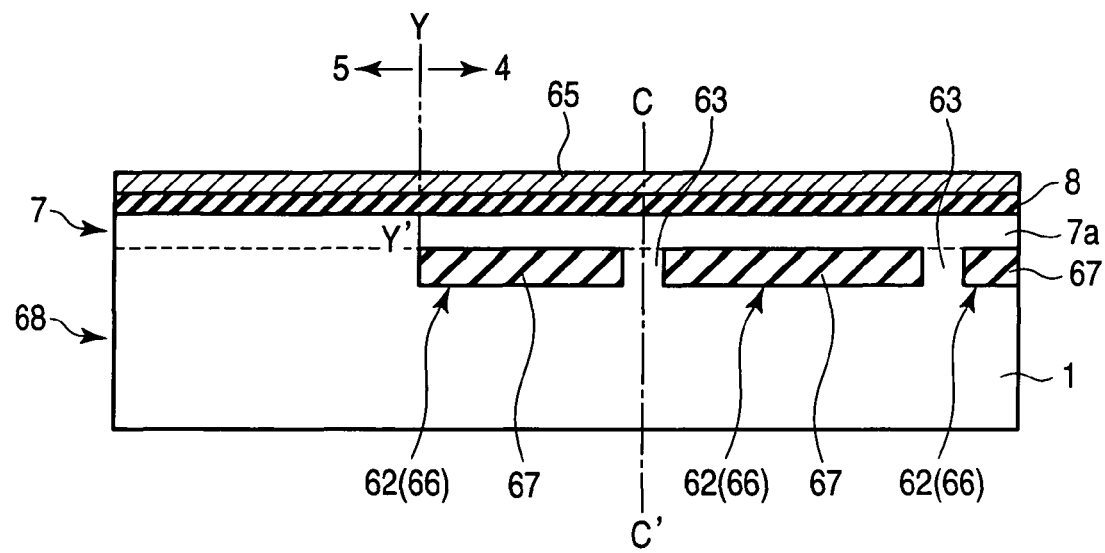
FIGS. 16A and 16B are sectional views showing manufacturing processes of the nonvolatile semiconductor memory device according to the third embodiment.
Figure 16B:
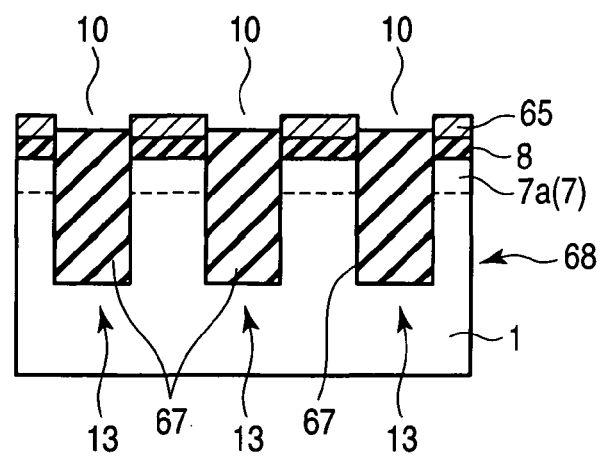

Next, as shown in FIGS. 16A and 16B, an insulating material 67 is provided inside each of the isolation trenches 10 and each of the cavities 66 by the coating method. The applied dielectric film 67 is embedded inside each of the isolation trenches 10 and each of the cavities 66 until the upper surface thereof reaches an intermediate part of the silicon nitride film 65. In contrast to the first and second embodiments, as described above, the embedded dielectric film 67 is provided in the present embodiment at a plurality of locations by being separated from each other in the surface layer part of the silicon crystal substrate 1 along the surface of the silicon crystal substrate 1. As shown in FIG. 16A, with the dielectric film 67 embedded inside each of the cavities 66, a partial SOI substrate 68 is formed in which the SOI area 4 where the silicon crystal layer 7 is provided on each of the dielectric films 67 and the non-SOI area 5 where the dielectric film 67 is not provided coexist in one silicon substrate.

Figure 17A:
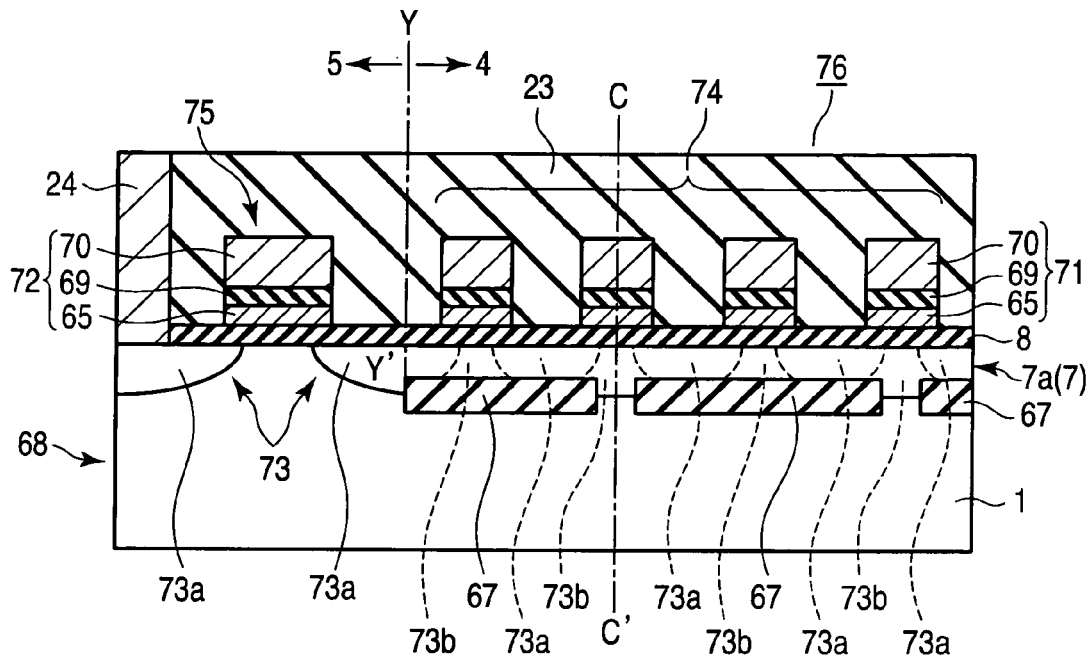
FIGS. 17A and 17B are sectional views showing manufacturing processes of the nonvolatile semiconductor memory device according to the third embodiment.
Figure 17B:
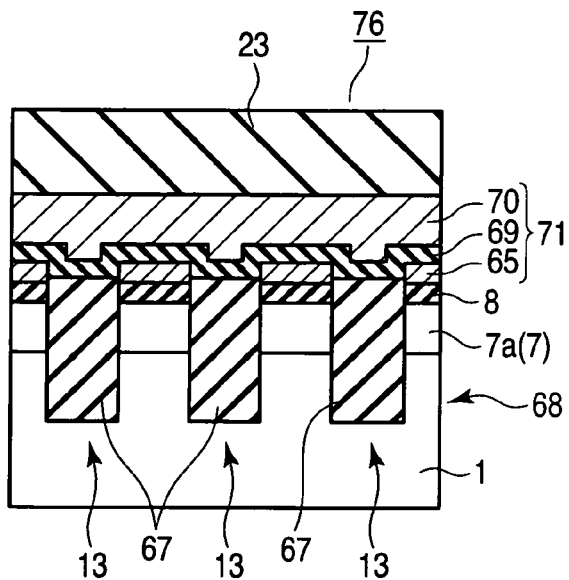

Next, as shown in FIGS. 17A and 17B, a second dielectric film 69 is provided by completely covering the surface of the embedded dielectric film 67 and that of the silicon nitride film 65. In contrast to the first and second embodiments, the second dielectric film 69 is formed in the present embodiment by using a silicon oxide film, instead of the alumina film 15. More specifically, the silicon oxide film 69 whose thickness is about 10 nm is caused to deposit completely on the surface of the embedded dielectric film 67 and that of the silicon nitride film 65 by the CVD method. Subsequently, a conductive layer 70 to be a control-gate electrode is provided by covering the surface of the silicon oxide film 69. In contrast to the first and second embodiments, the conductive layer 70 is formed in the present embodiment by using tungsten, which is a single element, instead of the tungsten silicide layer 17, which is a silicon compound. More specifically, the tungsten layer 70 whose thickness is about 50 nm is caused to deposit on the surface of the silicon oxide film 69 by the sputtering process.

Subsequently, the tungsten layer 70, the silicon oxide film 69, and the silicon nitride film 65 are partially cut off and removed until the surface of the silicon oxide film 8 and that of the embedded dielectric film 12 are exposed by the RIE method using a resist film (not shown) patterned to a stripe shape in accordance with patterns of gate structures 71 and 72 of a memory cell 74 and a select-gate transistor 75 respectively as a mask. As a result, as shown in FIG. 17A, a plurality of gate electrode structures 71 having the so-called MONOS structure, in which the silicon oxide film 8, the silicon nitride film 65, the silicon oxide film 69, and the tungsten layer (metal layer) 70 are stacked on the silicon crystal layer 7 (SOI layer 7a), is formed in the SOI area 4 of the partial SOI substrate 68. Similarly, a plurality of gate electrode structures 72 of the select-gate transistor 75 having the MONOS structure is formed in the non-SOI area 5 of the partial SOI substrate 68. Then, the resist film is removed from the surface of the tungsten layer 70. In the present embodiment, the tungsten layer 70 functions as a word line.

Subsequently, by the same processes as in the modification of the first embodiment, an n-type impurity diffusion layer 73 in which high-concentration impurity diffusion layers 73a and low-concentration impurity diffusion layers 73b are substantially integrated is formed in the SOI layer 7a and in the surface layer part of the silicon crystal substrate 1 laterally from the embedded dielectric film 67. While the embedded dielectric film 12 is formed overall below the SOI layer 7a in the first embodiment, the embedded dielectric film 67 is formed at a plurality of locations below the SOI layer 7a by being separated from each other in the present embodiment. Thus, the n-type impurity diffusion layer 73 (the low-concentration impurity diffusion layer 73b) extends into the silicon crystal substrate 1 between the embedded dielectric films 67.

A plurality of MONOS-type transistors 74 as memory cells having the gate electrode structure 71 and sharing the n-type impurity diffusion layer 73 is formed in the SOI area 4 by the processes up to now. In addition, a MONOS-type select-gate transistor 75 constituted by the stacked gate electrode structures 72 and the n-type impurity diffusion layer 73 is formed in the non-SOI area 5. Then, the interlayer dielectric film 23, the bit line contact plug 24 and the like are formed on the partial SOI substrate 68. Accordingly, a NAND-type nonvolatile memory 76 according to the present embodiment having the structure shown in FIGS. 17A and 17B is completed.

Figure 18A:
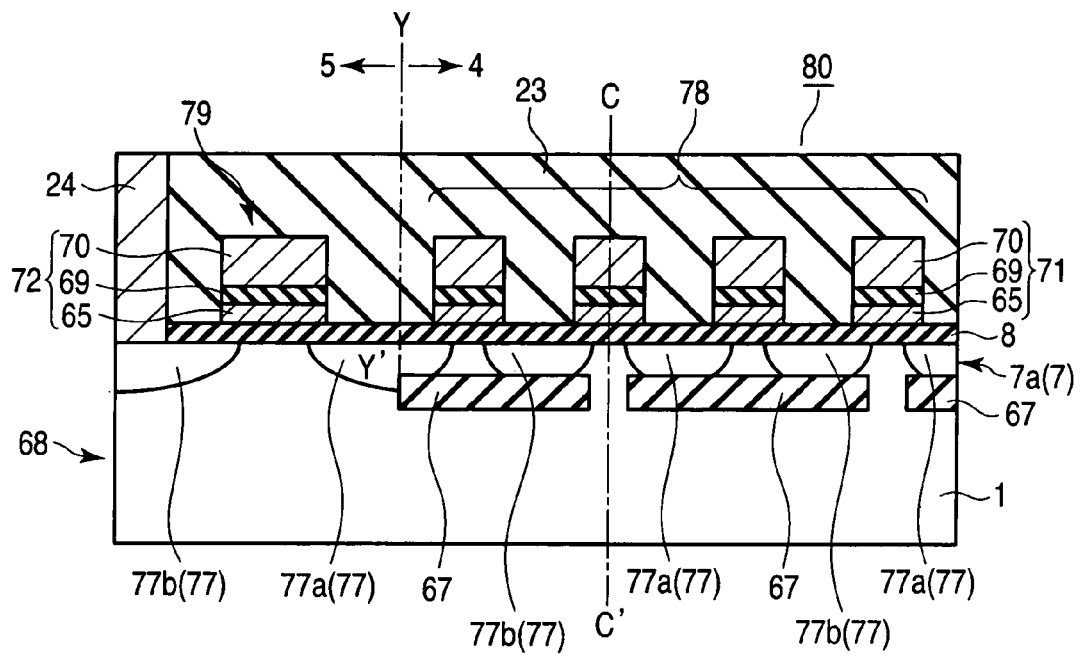
FIGS. 18A and 18B are diagrams showing a modification of the nonvolatile semiconductor memory device according to the third embodiment.
Figure 18B:
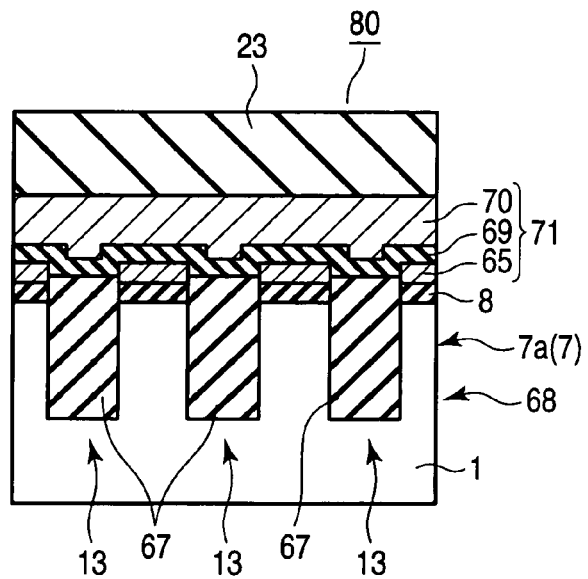

While the n-type impurity diffusion layer 73 of the mutually adjacent memory cells 74 is integrated in the nonvolatile memory 76, the present embodiment is not limited to this. For example, like the NAND-type flash memory 25 in the first embodiment, the n-type impurity diffusion layer 73 may be separated for each of the memory cells 74. In this case, the thermal diffusion process in which impurities are diffused from the source/drain diffusion layers toward an impurity non-injection area around the source/drain diffusion layer described with reference to FIGS. 9A and 9B in the first embodiment can be omitted. Accordingly, as shown in FIGS. 18A and 18B, an n-type impurity diffusion layer 77 in which source diffusion layers 77a and drain diffusion layers 77b are separated from each other is left in the SOI layer 7a and in the surface layer part of the silicon crystal substrate 1 laterally from the embedded dielectric film 67.

As a result, a plurality of MONOS-type transistors 78 as memory cells constituted by the gate electrode structure 71 and the source/drain diffusion layers 77a and 77b is formed in the SOI area 4. In addition, a MONOS-type select-gate transistor 79 constituted by the gate electrode structure 72 and the source/drain diffusion layers 77a and 77b is formed in the non-SOI area 5. Then, the interlayer dielectric film 23, the bit line contact plug 24 and the like are formed on the partial SOI substrate 68. Accordingly, a NAND-type nonvolatile memory 80, which is a modification of the NAND-type flash memory 76 described above, having the structure shown in FIGS. 18A and 18B is completed.

According to the third embodiment, as described above, effects similar to those in the first and second embodiments described above can be obtained. Also in the present embodiment, as described above, the height 63 made of silicon crystals and having a stripe shape is formed between the cavities 66. According to such a structure, sufficient mechanical strength of a stacked structure can be secured to an extent that the stacked structure in the SOI area 4 including the SOI layer 7a above the cavity 66 is neither bent nor broken even if the SOI area 4 is lengthened in the transverse direction to increase the number of memory cells 74/78 formed in the SOI area 4. Accordingly, a memory cell part having an SOI structure in which both excellent mechanical strength and excellent crystallizability are combined and for which the memory cells 74/78 are made further finer and highly integrated can be realized.

In contrast to memory cells in the first and second embodiments that are constituted by the floating-gate type transistors 21 and 27, memory cells in the present embodiment are constituted by the MONOS-type transistors 74 and 78. Generally, MONOS-type transistors have a simpler structure and are more compact than floating-gate type transistors. Thus, MONOS-type transistors are easier to fabricate than floating-gate type transistors. In addition, MONOS-type transistors are easier to make finer and to achieve higher integration than floating-gate type transistors, and also easier to combine with other semiconductor devices and passive components. Moreover, MONOS-type transistors have higher reliability and durability than floating-gate type transistors because malfunctioning such as charge leakage from a charge storage layer is less likely to occur. Further, MONOS-type transistors are easier to apply lower operating voltages than floating-gate type transistors and thus easier to achieve power savings.

The select-gate transistors 75 and 79 in the present embodiment are constituted by MONOS-type transistors using the same stacked structure as that of memory cells and therefore, manufacturing processes can be simplified to achieve lower costs. If the select-gate transistor needs to be made faster or more reliable, the gate dielectric film of the select-gate transistor may be produced separately. For example, a select-gate transistor having a gate dielectric film made of the silicon oxide film 69 can be formed by selectively removing the silicon nitride film 65 and the silicon oxide film 8 in a select-gate transistor formation area using a resist mask (not shown) or the like after the process described previously with reference to FIG. 16.

According to the present embodiment, as described above, characteristics fluctuations, malfunctioning, space occupancy, power consumption, the rate of occurrence of defective products, manufacturing costs and the like of the memory cells 74 and 78 can further be reduced. As a result, performance, quality, reliability, life, the degree of integration, yield, production efficiency, cost performance, the rate of energy saving and the like of the NAND-type nonvolatile memories 76 and 80 can further be improved.

Fourth Embodiment

Next, a fourth embodiment according to the present invention will be described with reference to FIGS. 19A to 32B. The same reference numbers are attached to the same components as those in the first to third embodiments described above and a detailed description thereof is omitted. In the present embodiment, an SOI structure memory cell capable of avoiding a malfunction of a nonvolatile semiconductor memory device by reducing fluctuations in potential of the SOI layer involved in a programming operation or erasing operation of the memory cell, and the formation method thereof will be described.

Figure 19A:
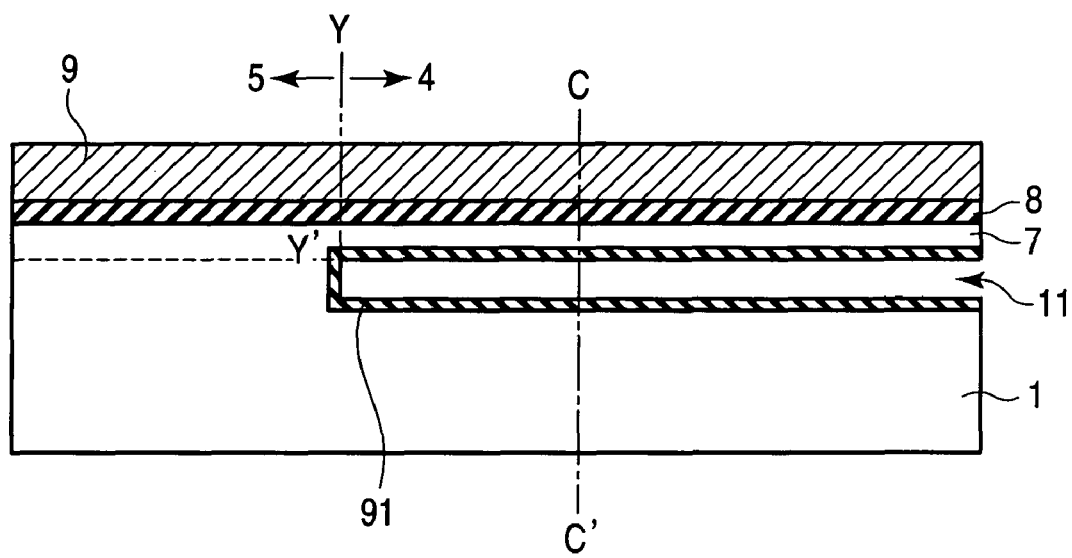
FIGS. 19A and 19B are sectional views showing manufacturing processes of a nonvolatile semiconductor memory device according to a fourth embodiment.
Figure 19B:
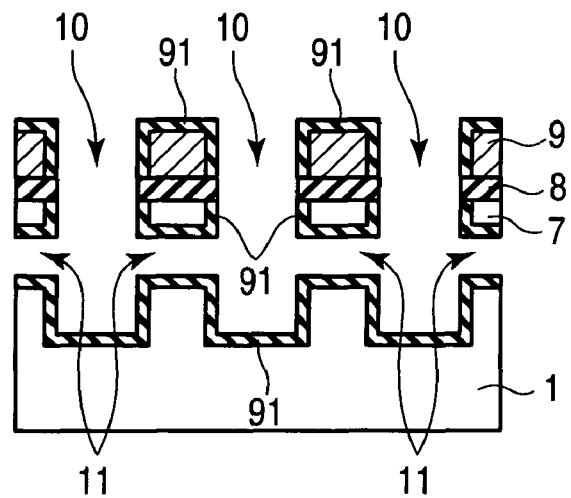

First, as shown in FIGS. 19A and 19B, a plurality of the isolation trenches 10 and cavities 11 is formed inside the silicon crystal substrate 1, the silicon crystal layer 7, the silicon oxide film 8, and the phosphorus-doped polysilicon layer 9 by processes similar to those described with reference to FIGS. 1A, 1B, and 1C to FIGS. 4A, 4B, and 4C in the first embodiment. Subsequently, thermal nitriding or radical nitriding is performed to each of the surface layer parts of the silicon crystal substrate 1, the silicon crystal layer 7, and the phosphorus-doped polysilicon layer 9 exposed to the inside of the isolation trenches 10 and cavities 11. An interface layer 91 made of a silicon nitride film is thereby formed in each of the surface layer parts of the silicon crystal substrate 1, the silicon crystal layer 7, and the phosphorus-doped polysilicon layer 9 constituting the inner surface of the isolation trenches 10 and cavities 11.

Next, as shown in FIGS. 20A and 20B, the silicon oxide film 12 to be an embedded dielectric film is embedded inside the isolation trenches 10 and cavities 11 where the interface layer 91 is formed by a process similar to that described with reference to FIGS. 5A, 5B, and 5C in the first embodiment. Accordingly, the silicon oxide film 12 is partially provided at least at one location in the surface layer part of the silicon crystal substrate 1 while a partial SOI substrate 92 in which the silicon nitride film 91 is provided at an interface among the silicon oxide film 12, the silicon crystal substrate 1, and the silicon crystal layer 7 is formed. Subsequently, the second dielectric film 15 is provided in the surface layer part by a process similar to that described with reference to FIGS. 6A, 6B, and 6C in the first embodiment. At this point, before forming the second dielectric film 15, as shown in FIG. 20B, chemical etching is performed to be able to remove an exposed part of the silicon nitride film 91. Subsequently, the plurality of memory cells 27 is formed in the SOI area 4 on the partial SOI substrate 92 and also the select-gate transistor 28 is formed in the non-SOI area 5 by a process similar to that described with reference to FIGS. 7A, 7B, and 7C to FIGS. 9A, 9B, and 9C. Then, the interlayer dielectric film 23, the bit line contact plug 24 and the like are formed on the partial SOI substrate 92. Accordingly, a NAND-type flash memory 93 according to the present embodiment having the structure shown in FIGS. 20A and 20B is completed.

Like the NAND-type nonvolatile memory 80 in the third embodiment described previously with reference to FIGS.

18A and 18B, the n-type impurity diffusion layer 26 of the NAND-type flash memory 93 may be separated for each of the memory cells 27. In this case, as described above, the thermal diffusion process in which impurities are diffused from the source/drain diffusion layers toward an impurity non-injection area around the source/drain diffusion layer can be omitted. Accordingly, a NAND-type flash memory 94, which is a first modification of the NAND-type flash memory 93 described above, having the structure shown in FIGS. 21A and 21B is completed.

The interface layer is not necessarily formed at all interfaces among the embedded dielectric film, silicon crystal substrate, and silicon crystal layer. An interface layer formed at least at an interface between the upper surface of the embedded dielectric film and the undersurface of the silicon crystal layer is sufficient. The method of forming a partial SOI substrate of such a structure and the method of manufacturing a NAND-type flash memory having such a partial SOI substrate will be described below.

First, as shown in FIG. 22A, a silicon oxide film 101 to be an embedded dielectric film whose thickness is about 50 nm is formed on the surface of the silicon crystal substrate 1 by, for example, the thermal oxidation method. Subsequently, a silicon nitride film 102 to be an interface layer whose thickness is about 2 nm is formed on the surface of the silicon oxide film 101 by, for example, the CVD method.

Next, as shown in FIG. 22B, the silicon nitride film 102 and the silicon oxide film 101 in the non-SOI area 5 are etched and removed until the surface of the silicon crystal substrate 1 is exposed using a resist film (not shown) as a mask. An opening 103 is thereby formed in the non-SOI area 5.

Next, as shown in FIG. 22C, a silicon crystal layer 104 is formed using, for example, the epitaxial growth method in the transverse direction along the surface of the silicon crystal substrate 1. More specifically, the silicon crystal layer 104 is epitaxially grown using the surface of the silicon crystal substrate 1 exposed in the opening 103 as a substrate (seed layer) until the thickness thereon reaches about 50 nm and the surface of the silicon nitride film 102 is overall covered. A portion of the silicon crystal layer 104 above the silicon oxide film 101 and silicon nitride film 102 becomes an SOI layer 104a. With processes up to now, a partial SOI substrate 105 if formed in which the silicon nitride film 102 is formed as an interface layer at an interface between the upper surface of the embedded dielectric film 101 and the undersurface of the silicon crystal layer 104.

Figure 23A:
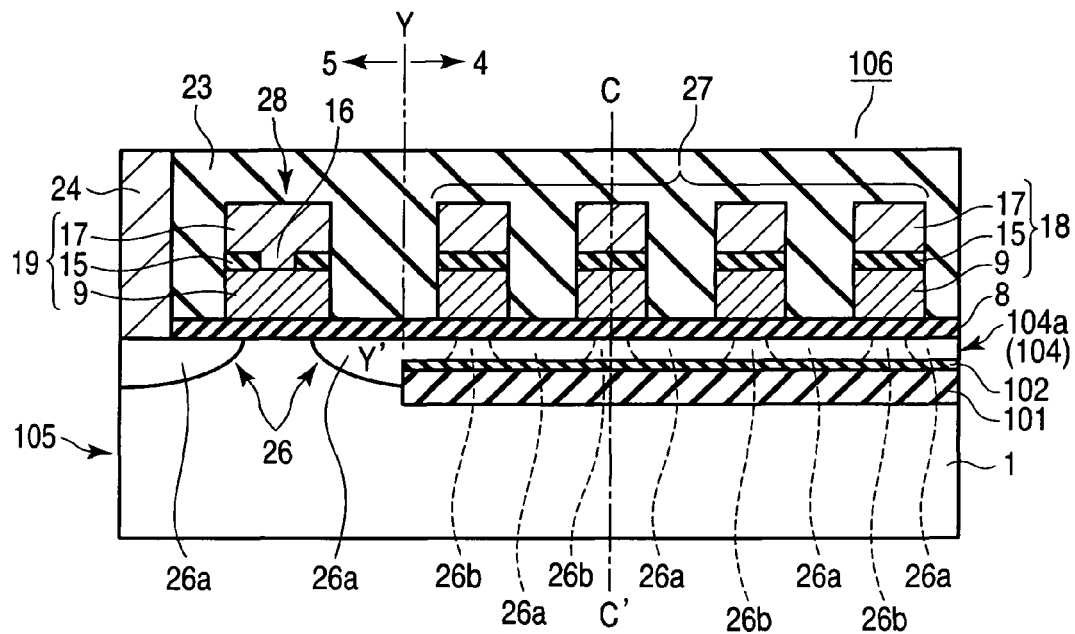
FIGS. 23A and 23B are sectional views showing manufacturing processes of the second modification of the nonvolatile semiconductor memory device according to the fourth embodiment.
Figure 23B:
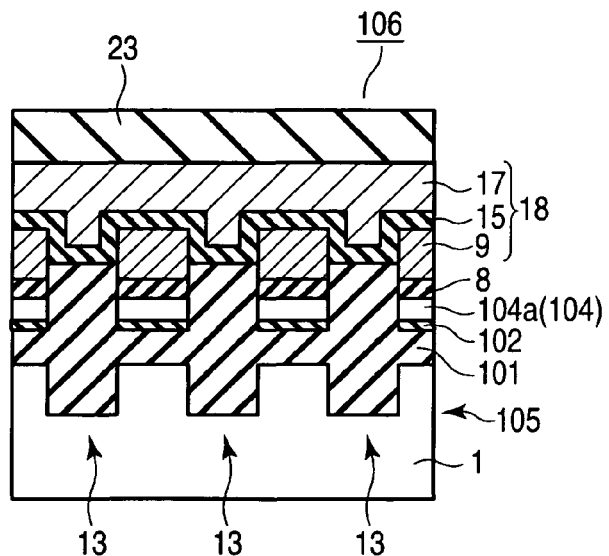

Next, as shown in FIG. 22D, the silicon oxide film 8 to be a tunnel dielectric film whose thickness is about 7 nm is formed on the surface of the silicon crystal layer 104 by, for example, the thermal oxidation method. Subsequently, the phosphorus-doped polysilicon layer 9 to be a floating-gate electrode whose thickness is about 50 nm is formed on the surface of the silicon oxide film 8 by, for example, the CVD method. Then, a NAND-type flash memory 106, which is a second modification of the NAND-type flash memory 93, having the structure shown in FIGS. 23A and 23B is completed by undergoing a manufacturing process similar to that of the NAND-type flash memory 93 described above.

Like the NAND-type flash memory 94 described previously with reference to FIGS. 21A and 21B, the n-type impurity diffusion layer 26 of the NAND-type flash memory 106 may be separated for each of the memory cells 27. In this case, the above thermal diffusion process can be omitted from the manufacturing process of the NAND-type flash memory 106. Accordingly, a NAND-type flash memory 107, which is a third modification of the NAND-type flash memory 93 described above, having the structure shown in FIGS. 24A and 24B is completed.

By applying the present embodiment to the partial SOI structure in the third embodiment in which an embedded dielectric film is separated from each other along the surface of a silicon crystal substrate to provide the embedded dielectric film at a plurality of locations in the surface layer part of the silicon crystal substrate, an interface layer may be formed by covering the entire surface of each of the embedded dielectric films.

First, for example, as shown in FIGS. 25A and 25B, a plurality of the isolation trenches 10 and cavities 66 is formed inside the silicon crystal substrate 1, the silicon crystal layer 7, the silicon oxide film 8, and the charge storage layer 9 by a process similar to that described with reference to FIGS. 12A, 12B, and 12C to FIGS. 15A and 15B in the third embodiment. However, while the silicon nitride film 65 is formed as a charge storage layer in the third embodiment, the phosphorus-doped polysilicon layer 9 is formed here as a charge storage layer. Subsequently, like the above process for forming the NAND-type flash memories 93/94, thermal nitriding or radical nitriding is performed to each of the surface layer parts of the silicon crystal substrate 1, the silicon crystal layer 7, and the phosphorus-doped polysilicon layer 9 exposed to the inside of each of the isolation trenches 10 and cavities 66 to form an interface layer 111 made of a silicon nitride film.

Figure 26A:
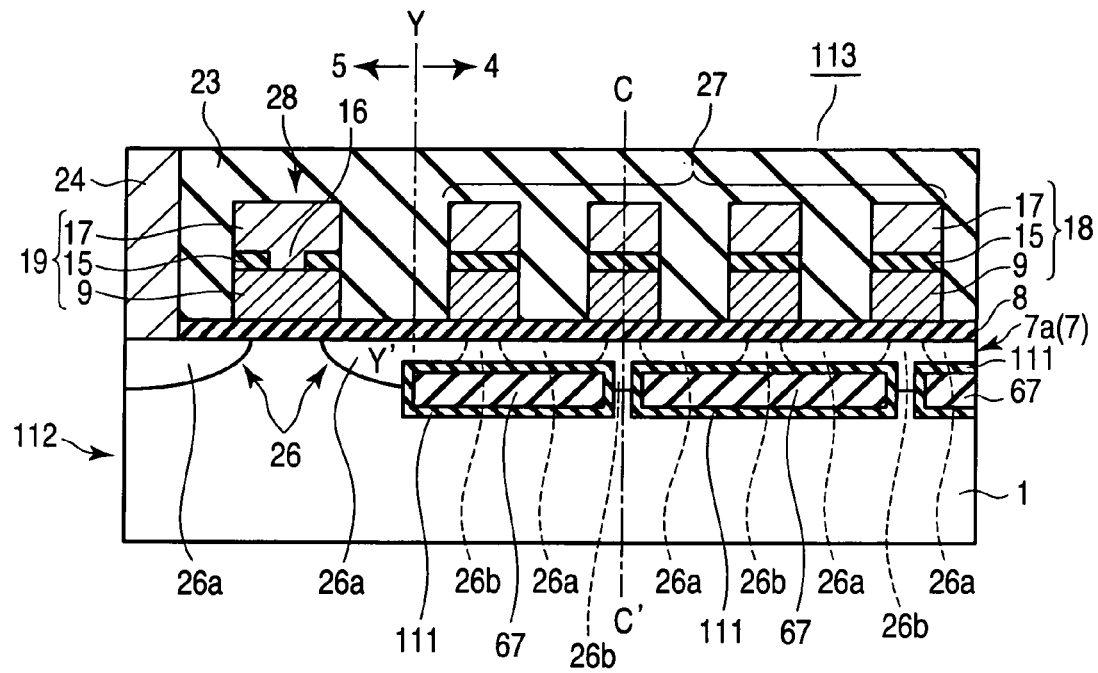
FIGS. 26A and 26B are sectional views showing manufacturing processes of the fourth modification of the nonvolatile semiconductor memory device according to the fourth embodiment.
Figure 26B:
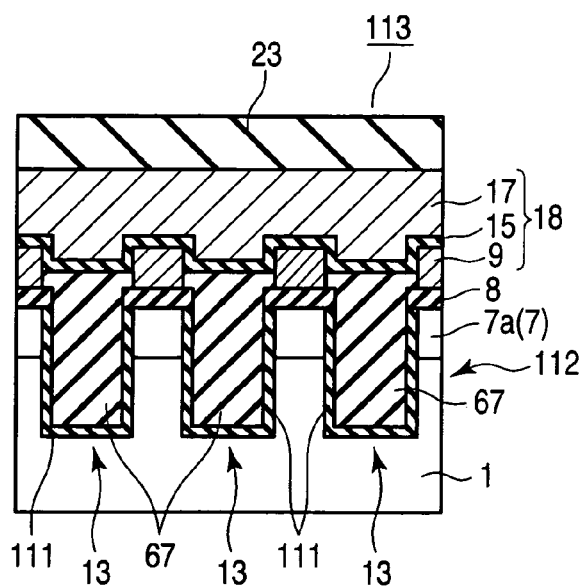

Next, as shown in FIGS. 26A and 26B, the silicon oxide film 67 to be an embedded dielectric film is embedded inside each of the isolation trenches 10 and cavities 66 where the interface layer 91 is formed by a process similar to that described with reference to FIGS. 16A and 16B in the third embodiment. Accordingly, the silicon oxide film 67 is partially provided at a plurality of locations in the surface layer part of the silicon crystal substrate 1 by being separated from each other while there is formed a partial SOI substrate 112 in which the silicon nitride film 111 is provided at all interfaces among the silicon oxide film 67, the silicon crystal substrate 1, and the silicon crystal layer 7. Subsequently, a plurality of memory cells is formed in the SOI area 4 on the partial SOI substrate 112 and also a select-gate transistor is formed in the non-SOI area 5 by a process similar to that described with reference to FIGS. 17A and 17B in the third embodiment. At this point, as shown in FIG. 26B, an exposure part of the silicon nitride film 111 can be removed by performing chemical etching before the second dielectric film 15 is formed.

As described above, the phosphorus-doped polysilicon layer 9 is formed here as a charge storage layer. Moreover, the alumina film 15 is formed as a second dielectric film instead of the silicon oxide film 69 and also, the tungsten silicide layer 17 is formed as a conductive layer to be a control-gate electrode instead of the tungsten layer 70. Thus, the floating-gate type memory cell 27 and the select-gate transistor 28 are formed in place of the MONOS-type memory cells 74 and 78 and the select-gate transistors 75 and 79 formed in the third embodiment. Then, a NAND-type flash memory 113, which is a fourth modification of the NAND-type flash memory 93, having the structure shown in FIGS. 26A and 26B is completed by undergoing a manufacturing process similar to that of the NAND-type flash memories 93 and 106 described above.

Like the NAND-type flash memories 94 and 107 described previously with reference to FIGS. 21A and 21B, and FIGS. 24A and 24B respectively, the n-type impurity diffusion layer 26 of the NAND-type flash memory 113 may be separated for each of the memory cells 27. In this case, the above thermal diffusion process can be omitted from the manufacturing process of the NAND-type flash memory 113. Accordingly, a NAND-type flash memory 114, which is a fifth modification of the NAND-type flash memory 93 described above, having the structure shown in FIGS. 27A and 27B is completed.

Further, by similarly applying the present embodiment to the partial SOI structure in the third embodiment in which an embedded dielectric film is separated from each other along the surface of a silicon crystal substrate to provide the embedded dielectric film at a plurality of locations in the surface layer part of the silicon crystal substrate, an interface layer may be formed by covering only the upper surface of each of the embedded dielectric films.

Figure 28A:
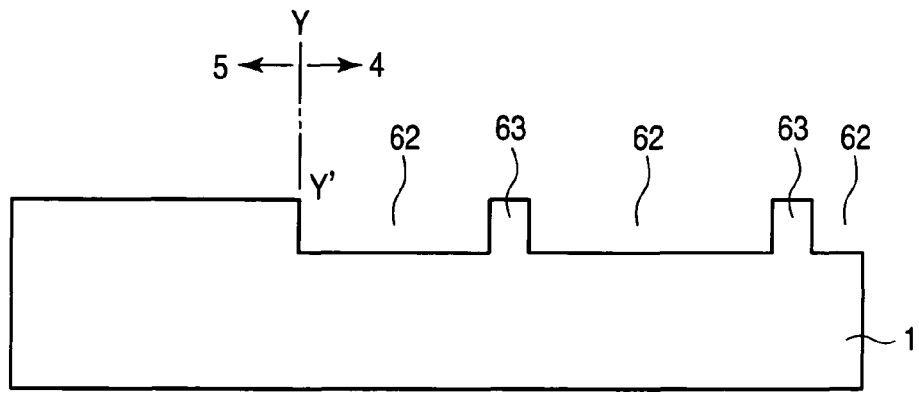
FIGS. 28A, 28B, and 28C are diagrams showing manufacturing processes of a sixth modification of the nonvolatile semiconductor memory device according to the fourth embodiment.
Figure 28B:
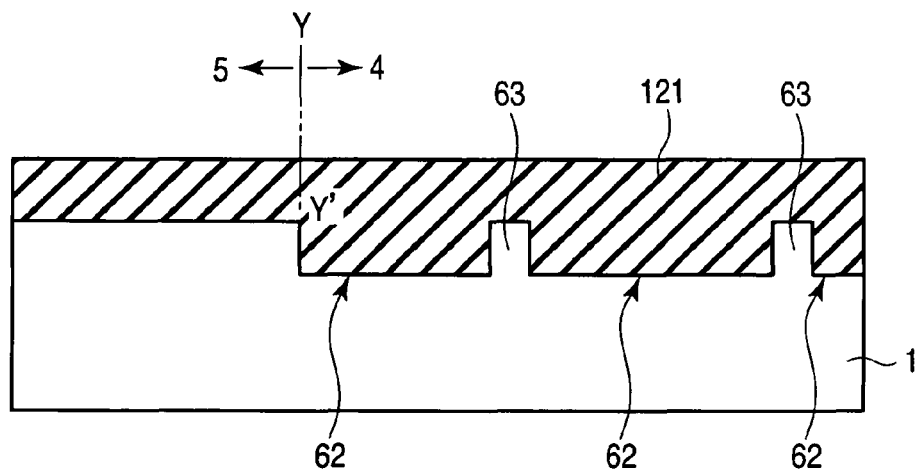
Figure 28C:
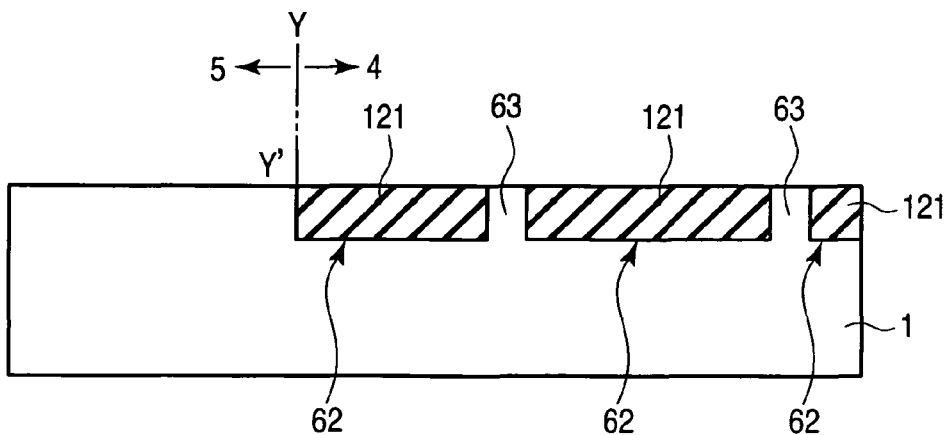

First, for example, as shown in FIG. 28A, the recess 62 is formed at a plurality of locations in the surface layer part of the SOI area 4 by partially digging from the surface of the silicon crystal substrate 1 and also one height 63 having a stripe shape is formed between the mutually adjacent recesses 62 by a process similar to that described with reference to FIGS. 12A, 12B, and 12C in the third embodiment. Subsequently, as shown in FIG. 28B, a silicon oxide film 121 to be an embedded dielectric film is provided on the surface of the silicon crystal substrate 1 where the recesses 62 and the heights 63 are formed by, for example, the CVD method. Subsequently, as shown in FIG. 28C, the silicon oxide film 121 is embedded inside each of the recesses 62 by polishing and removing the silicon oxide film 121 on the surface of the silicon crystal substrate 1 by, for example, the CMP method.

Figure 29A:
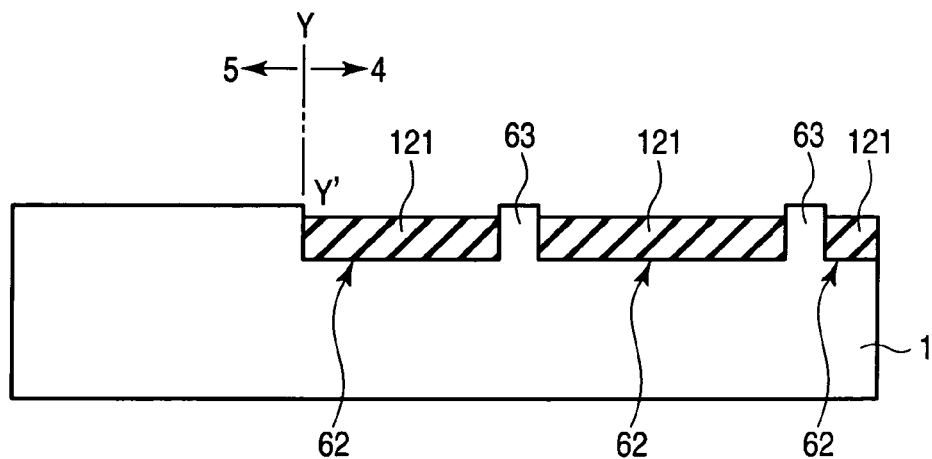
FIGS. 29A, 29B, and 29C are diagrams showing manufacturing processes of the sixth modification of the nonvolatile semiconductor memory device according to the fourth embodiment.
Figure 29B:
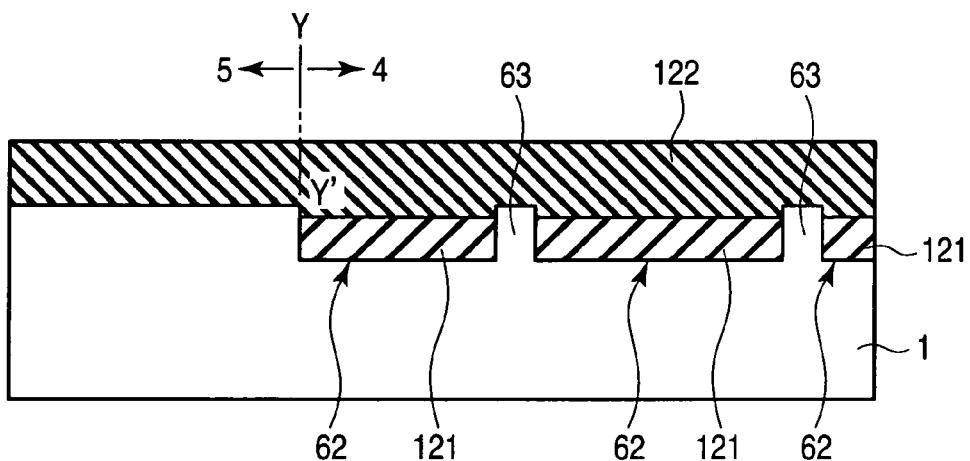
Figure 29C:
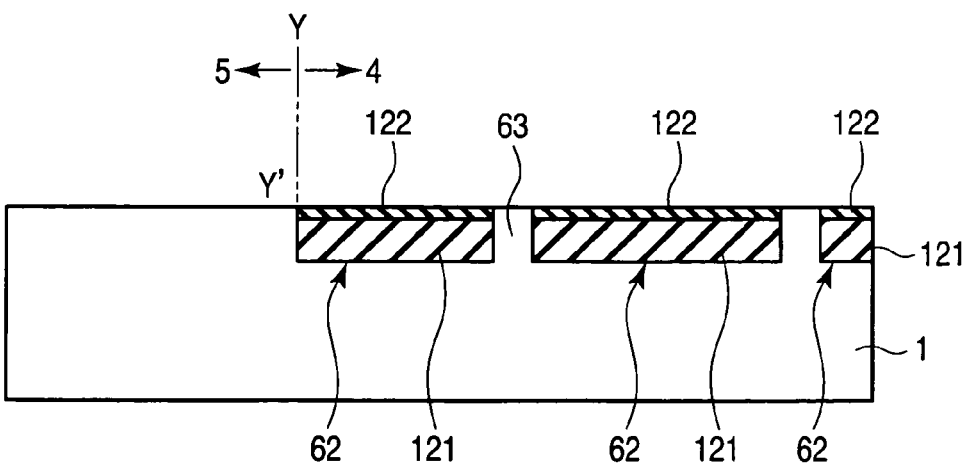

Next, as shown in FIG. 29A, the silicon oxide film 121 embedded inside each of the recesses 62 is caused to retreat by selectively etching the silicon oxide film 121 by, for example, RIE method. Subsequently, as shown in FIG. 29B, a silicon nitride film 122 to be an interface layer is provided by, for example, the CVD method covering the surface of the silicon crystal substrate 1 and the surface of the silicon oxide film 121 whose upper surface is lowered from the surface of the silicon crystal substrate 1. Subsequently, as shown in FIG. 29C, the silicon nitride film 122 is embedded inside each of the recesses 62 by polishing and removing the silicon nitride film 122 on the surface of the silicon crystal substrate 1 by, for example, the CMP method. Accordingly, a stacked structure of the silicon oxide film 121 to be an embedded dielectric film and the silicon nitride film 122 to be an interface layer is formed inside each of the recesses 62.

Figure 30A:
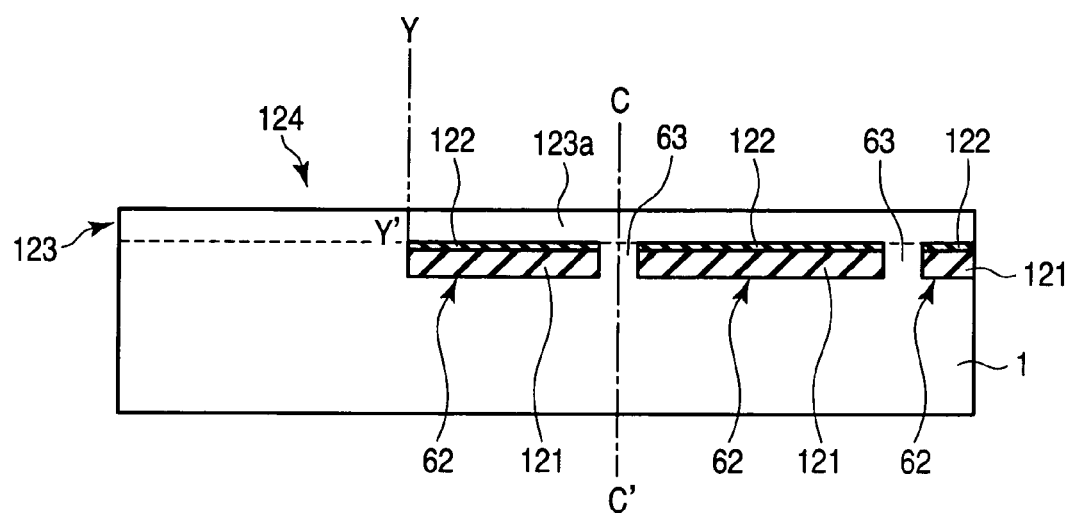
FIGS. 30A and 30B are diagrams showing manufacturing processes of the sixth modification of the nonvolatile semiconductor memory device according to the fourth embodiment.
Figure 30B:
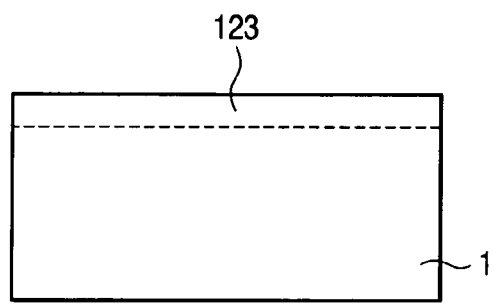
Figure 31A:
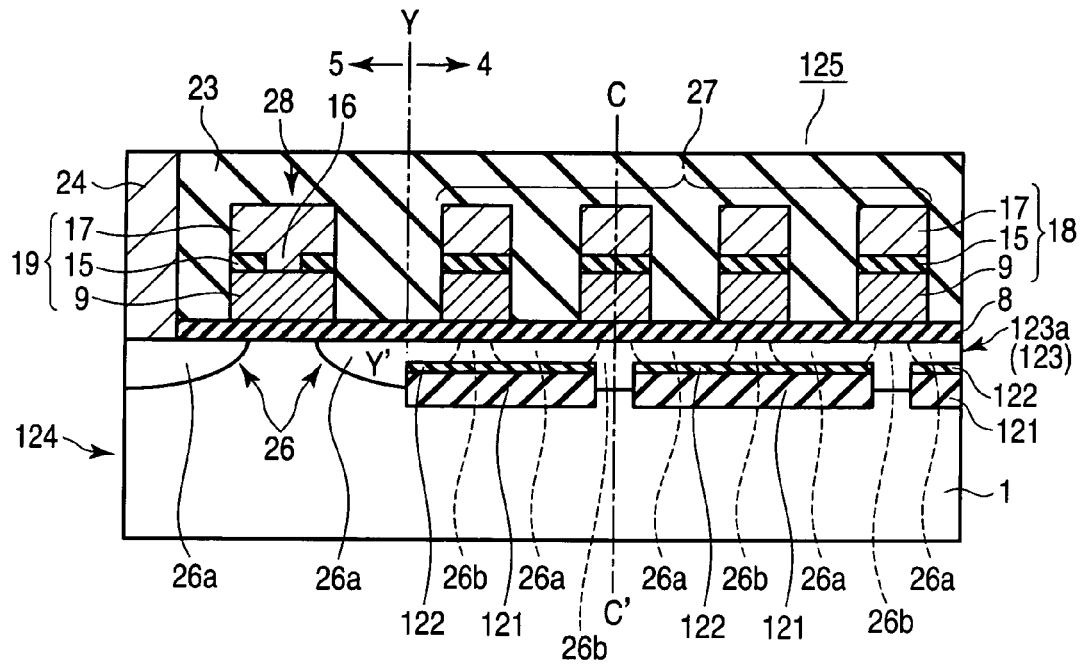
FIGS. 31A and 31B are diagrams showing manufacturing processes of the sixth modification of the nonvolatile semiconductor memory device according to the fourth embodiment.
Figure 31B:
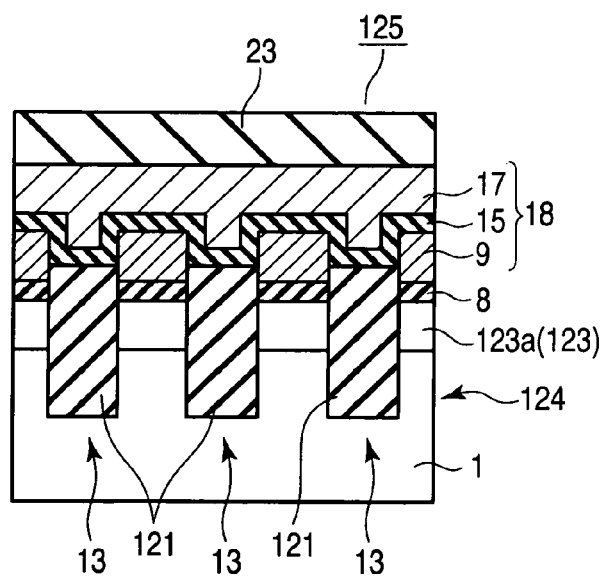

Next, as shown in FIGS. 30A and 30B, a silicon crystal layer 123 is formed on both surfaces of the silicon crystal substrate 1 and the silicon nitride film 122 by the epitaxial growth method using the surface of the silicon crystal substrate 1 as a substrate like the process described with reference to FIGS. 13A and 13B in the third embodiment. However, in contrast to the third embodiment, the silicon crystal layer 123 is formed by the epitaxial growth method in the transverse direction, instead of the epitaxial growth method in the longitudinal direction. Accordingly, the dielectric film 121 is partially provided at a plurality of locations in the surface layer part of the silicon crystal substrate 1 by being separated from each other and also a partial SOI substrate 124 in which the silicon nitride film 111 is selectively provided at an interface among the upper surface of each of the embedded dielectric films 121, the silicon crystal substrate 1, and the silicon crystal layer 123 is formed. A portion of the silicon crystal layer 123 above each of the embedded dielectric films 121 becomes an SOI layer 123a. Then, a NAND-type flash memory 125, which is a sixth modification of the NAND-type flash memory 93, having the structure shown in FIGS. 31A and 31B is completed by undergoing a manufacturing process similar to that described with reference to FIGS. 14A, 14B, and 14C, FIGS. 16A, 16B, and 16C, and FIGS. 17A, 17B, and 17C.

In the NAND-type flash memory 125, like the NAND-type flash memory 113 described above, a charge storage layer, a second dielectric film, and a conductive layer to be a control-gate electrode are formed by using the phosphorus-doped polysilicon layer 9, the alumina film 15, and the tungsten silicide layer 17 respectively. Therefore, in contrast to the NAND-type nonvolatile memories 76 and 80 in the third embodiment, the floating-gate type memory cell 27 is formed in the SOI area 4 of the NAND-type flash memory 125 and the select-gate transistor 28 having substantially the same structure as that of the memory cell 27 is formed in the non-SOI area 5.

Like the NAND-type flash memories 94, 107, and 114 described previously with reference to FIGS. 21A and 21B, FIGS. 24A and 24B, and FIGS. 27A and 27B respectively, the n-type impurity diffusion layer 26 of the NAND-type flash memory 125 may be separated for each of the memory cells 27. In this case, the above thermal diffusion process can be omitted from the manufacturing process of the NAND-type flash memory 125. Accordingly, a NAND-type flash memory 126, which is a seventh modification of the NAND-type flash memory 93 described above, having the structure shown in FIGS. 32A and 32B is completed.

According to the fourth embodiment, as described above, effects similar to those in the first to third embodiments described above can be obtained. The n-type impurity diffusion layers 26 (26a, 26b) of each of the memory cells 27 are connected and integrated in the NAND-type flash memories 93, 106, 113, and 125. In addition, the interface layers 91, 102, 111, and 122 made of a silicon nitride film are provided at an interface between the upper surface of the embedded dielectric films 12, 67, 101, and 121 made at least of a silicon oxide film and the undersurface of the silicon crystal layers 7, 104, and 123 (the SOI layers 7a, 104a, and 123a) in the NAND-type flash memories 93, 106, 113, and 125.

According to such a structure, if the density of electrons, which are majority carriers, in the n-type impurity diffusion layers 26 (26a, 26b) increases or decreases from that in a thermal equilibrium state, the density of electrons in an excessive state or an insufficient state can quickly be brought back to the density of thermal equilibrium state. That is, the interface layers 91, 102, 111, and 122 have a function of a generation-recombination center of carriers. Therefore, for example, when an erasing operation of each of the memory cells 27 is performed, fluctuations in potential involved in an increase in electron density in the n-type impurity diffusion layers 26 (26a, 26b) due to electron transport from the floating-gate electrode 9 to the SOI layers 7a, 104a, and 123a can substantially be ignored. Thus, by providing at least the interface layers 91, 102, 111, and 122 at an interface between the upper surface of the embedded dielectric films 12, 67, 101, and 121 and the undersurface of the SOI layers 7a, 104a, and 123a, characteristics fluctuations of each of the memory cells 27 due to carrier storage by the SOI layers 7a, 104a, and 123a can be avoided. As a result, malfunctioning of the NAND-type flash memories 93, 106, 113, and 125 can be avoided more effectively.

In the NAND-type flash memories 94, 107, 114, and 126, the n-type impurity diffusion layers 20 (20a, 20b) of each of the memory cells 21 are separated from each other. However, with such a structure, an effect similar to that of the above NAND-type flash memories 93, 106, 113, and 125 can still be obtained. For example, when a programming operation to each of the memory cells 21 is performed, electrons are transported from the SOI layers 7a, 104a, and 123a into the floating-gate electrode 9. Then, substantially at the same time, holes are transported from the floating-gate electrode 9 into the SOI layers 7a, 104a, and 123a, changing potentials inside the SOI layers 7a, 104a, and 123a. At this point, like the memory cells 27 described above, the interface layers 91, 102, 111, and 122 act as a recombination center of holes in the memory cells 21 of the NAND-type flash memories 94, 107, 114, and 126. Thus, fluctuations in potentials in the SOI layers 7a, 104a, and 123a during a programming operation to each of the memory cells 21 can substantially be ignored. As a result, like the NAND-type flash memories 93, 106, 113, and 125, malfunctioning of the NAND-type flash memories 94, 107, 114, and 126 can be avoided more effectively.

Further, the interface layers 91, 102, 111, and 122 need not necessarily be provided, like the NAND-type flash memories 93, 94, 113, and 114, by covering the entire surface of the embedded dielectric films 12, 67, 101, and 121. Like the NAND-type flash memories 106, 107, 125, and 126, the interface layers 91, 102, 111, and 122 need only to be provided at an interface between the upper surface of the embedded dielectric films 12, 67, 101, and 121 and the undersurface of the silicon crystal layers 7, 104, and 123 (the SOI layers 7a, 104a, and 123a). Even with such a structure, the interface layers 91, 102, 111, and 122 can acquire a function as the above-described generation-recombination center of carriers. That is, like the NAND-type flash memories 93, 94, 113, and 114, the NAND-type flash memories 106, 107, 125, and 126 are less likely to malfunction.

In the NAND-type flash memories 106, 107, 125, and 126 shown in FIGS. 23B, 24B, 31B, and 32B, in contrast to the NAND-type flash memories 93, 94, 113, and 114 shown in FIGS. 20B, 21B, 26B, and 27B, no interface layer is formed at an interface between the embedded dielectric films 12, 101, and 121 and the SOI layers 104a and 123a. That is, the interface layers 102 and 122 are not in contact with a channel area (not shown) immediately below the tunnel dielectric film 8 in the NAND-type flash memories 106, 107, 125, and 126. According to such a structure, controllability of threshold values of each of the memory cells 21 and 27 can be enhanced and thus, for example, channel current degradation can be made harder to be caused when each of the memory cells 21 and 27 is caused to perform a reading operation. Therefore, the NAND-type flash memories 106, 107, 125, and 126 and the memory cell structures 21 and 27 thereof are more suitable than the NAND-type flash memories 93, 94, 113, and 114 and the memory cell structures 21 and 27 thereof for application to an environment in which faster operations are demanded.

Nonvolatile semiconductor memory devices according to the present invention and manufacturing methods thereof are not limited to the above first to fourth embodiments. Components thereof or a portion of manufacturing steps may be set or modified in various ways, or various settings may be used when needed by combining them appropriately without deviating from the scope of the present invention.

For example, in the first and third embodiments, the silicon-germanium mixed crystal layers 6 and 64 to be an embedded spacer layer are once formed inside the silicon crystal substrate 1. Subsequently, the silicon crystal layer 7 is epitaxially grown using the silicon-germanium mixed crystal layers 6 and 64 and the silicon crystal substrate 1 as substrates. Subsequently, the silicon-germanium mixed crystal layers 6 and 64 are selectively removed from inside the silicon crystal substrate 1 to form the cavities 11 and 66. Then, the partial SOI structures 14 and 68 are formed by embedding the silicon oxide films 12 and 67 inside the cavities 11 and 66.

However, even if the partial SOI structures 14 and 68 are formed by undergoing such a process, the material of the embedded spacer layers 6 and 64 is not limited to the silicon-germanium mixed crystal layer. The embedded spacer layers 6 and 64 may be formed using any other material that allows the silicon crystal layer 7 to epitaxially grow as a material (seed layer) for epitaxial growth and secures etching selectivity with other layers containing silicon crystals such as the silicon crystal substrate 1 and the silicon crystal layer 7 (the SOI layer 7a).

Combinations of material of the embedded spacer layer 6 and that of the silicon crystal layer 7 using the embedded spacer layer 6 as a seed layer that can make full use of the above features will be described below. If, for example, the embedded spacer layer 6 is formed from phosphorus-doped silicon, the silicon crystal layer 7 may be formed using silicon (undoped silicon) to which no impurity is added. Here, such a combination of materials is denoted as (undoped) silicon/phosphorus-doped silicon. Then, other combinations of materials that can make full use of similar features include (undoped) silicon/boron-doped silicon, (undoped) silicon-germanium/phosphorus-doped silicon-germanium, and (undoped) silicon-germanium/boron-doped silicon-germanium.

In the first embodiment, the phosphorus-doped polysilicon layer 9 is further phosphorus-doped before only the silicon-germanium mixed crystal layer 6 is selectively etched and removed from a stacked structure constituted by the silicon crystal substrate 1, the silicon-germanium mixed crystal layer 6, the silicon crystal layer 7, the silicon oxide film 8, and the phosphorus-doped polysilicon layer 9. Accordingly, etching selectivity of the silicon-germanium mixed crystal layer 6 with respect to the phosphorus-doped polysilicon layer 9 to be a change storage layer is sufficiently increased. As a result, only the silicon-germanium mixed crystal layer 6 can selectively be etched without the phosphorus-doped polysilicon layer 9 being etched. However, the method of selectively etching the silicon-germanium mixed crystal layer 6 without the phosphorus-doped polysilicon layer 9 being etched is not limited to this.

For example, a charge storage layer may be formed using an undoped silicon layer which is harder to etch than the silicon-germanium mixed crystal layer 6 and to which no impurity is added. According to this method, only the silicon-germanium mixed crystal layer 6 can be etched selectively and easily without the undoped silicon layer being etched. Then, after the embedded dielectric film 12 is provided in the cavity 11 formed by removal of the silicon-germanium mixed crystal layer 6, the undoped silicon layer may be phosphorus-doped by the ion implantation method so that the undoped silicon layer functions as the floating-gate electrode 9. The NAND-type flash memories 25 and 29 in the first embodiment can also be manufactured by the above method.

In each of the first to fourth embodiments, the impurity diffusion layers 20, 26, 40, 73, and 77 are formed by injecting impurities into the surface layer part of the silicon crystal substrate 1 and the silicon crystal layers 7, 32, 104, and 123 after a plurality of memory cells 21, 27, 35, 74, and 78 is formed on the silicon crystal layers 7, 32, 104, and 123 (the SOI layers 7a, 32a, 104a, and 123a), but the method of forming the impurity diffusion layer is not limited to this. For example, before removing the silicon-germanium mixed crystal layer 6 from inside the silicon crystal substrate 1 and the silicon crystal layers 7, 32, 123, impurities may fully be injected into the surface layer part of the silicon crystal substrate 1 and the silicon crystal layers 7, 32, 123 in advance using the so-called through implantation method. Impurity diffusion layers are thereby formed in the surface layer part of the silicon crystal substrate 1 and inside the silicon crystal layers 7, 32, 123.

Then, like each of the first to fourth embodiments, impurities are again injected into the surface layer part of the silicon crystal substrate 1 and the silicon crystal layers 7, 32, 123 using the gate electrode structures 18 and 71 of the memory cells 21, 27, 35, 74, and 78 as a mask. Accordingly, like the memory cells 27 and 74 of the NAND-type flash memories 29, 76, 93, 106, 113, and 125, the memory cells 27 and 74 sharing the impurity diffusion layers 26 and 73 in which the high-concentration impurity diffusion areas 26a and 73a and the low-concentration impurity diffusion areas 26b and 73b are connected can be formed.

The fourth embodiment showed a case in which the embedded dielectric films 12, 67, 101, and 121 made of a silicon oxide film and the interface layers 91, 102, 111, and 122 made of a silicon nitride film are combined for use, but the combination of the embedded dielectric films and interface layers is not limited to this. For example, an embedded dielectric film made of a silicon oxynitride film may be combined with an interface layer made of a high-concentration silicon oxynitride film whose nitrogen concentration is higher than that of the silicon oxynitride film of the embedded dielectric film. Also in this case, an effect of the generation-recombination center of carriers increases with an increasing nitrogen concentration and therefore, an effect of avoiding a malfunction of a nonvolatile semiconductor memory device can further be enhanced by reducing potential fluctuations of an SOI layer.

Materials of an interface layer may be, in addition to the silicon nitride film and silicon oxynitride film, a silicon carbide layer or a silicon oxide layer containing carbon. Also in this case, an effect similar to that obtained when the interface layer is formed using a silicon nitride film and silicon oxynitride film can be obtained. For example, after forming isolation trenches and cavities in which a dielectric film is embedded, an interface layer made of a high-concentration silicon oxynitride film, a silicon carbide film, or a silicon oxide film containing carbon may be formed on the surface of a silicon crystal substrate or an SOI layer exposed inside the isolation trenches or cavities. Alternatively, after embedding a dielectric material containing at least one of nitrogen and carbon inside the isolation trenches and cavities as an embedded dielectric film, an interface layer made of a high-concentration silicon oxynitride film, a silicon carbide film, or a silicon oxide film containing carbon may be formed by diffusing nitrogen or carbon in the film through heating. Thus, the interface layer only needs to be a layer of semiconductor compounds containing at least one of the nitrogen and carbon.

Further, in each of the first, second, and fourth embodiments, the charge storage layer 9 is formed from a phosphorus-doped polysilicon layer and also memory cells are constituted by using the floating-gate type transistors 21, 27, and 35 in which the phosphorus-doped polysilicon layer 9 serves as a floating-gate electrode. However, the memory cell is not limited to the floating-gate type transistors 21, 27, and 35. For example, by applying the process described in the third embodiment to each of the first, second, and fourth embodiments, memory cells may be constituted by using the MONOS-type transistors 74 and 78 in which a dielectric film such as silicon nitride film serves as a charge storage layer, instead of each of the floating-gate type transistors 21, 27, and 35. Conversely, by applying the process described in the first embodiment to the third embodiment, memory cells may be constituted by using the floating-gate type transistors 21, 27, and 35 in which the phosphorus-doped polysilicon layer 9 serves as a floating-gate electrode, instead of each of the MONOS-type transistors 74 and 78. Further, instead of each of the MONOS-type transistors 74 and 78, memory cells may be constituted by using so-called SONOS-type transistors in which a metal layer (M) in the MONOS structure is replaced by a silicon layer (S).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate having a semiconductor layer and an insulating material provided on a surface thereof, a surface of the insulating material being covered with the semiconductor layer;
   a plurality of memory cells provided on the semiconductor layer, the memory cells comprising:
   a first dielectric film provided by covering the surface of the semiconductor layer;
   a plurality of charge storage layers, each of which is provided above the insulating material and on the first dielectric film;
   a plurality of second dielectric films, each of which is provided on the each charge storage layer;
   a plurality of conductive layers, each of which is provided on the each second dielectric film; and
   an impurity diffusion layer formed partially or overall at least above the insulating material and inside the semiconductor layer and at least a portion of a bottom end thereof being provided by an upper surface of the insulating material;
   a semiconductor compound layer containing at least one of nitrogen and carbon and provided at an interface at least between the upper surface of the insulating material and the semiconductor layer; and
   a select-gate transistor provided on the semiconductor substrate, the select-gate transistor comprising:
   a third dielectric film provided by covering a surface of the semiconductor substrate; and
   a second conductive layer provided on the third dielectric film,
   wherein the insulating material is provided under the memory cells and is not provided under the select-gate transistor.

2. A nonvolatile semiconductor memory device comprising:
   a semiconductor substrate having a semiconductor layer and an insulating material provided on a surface thereof, a surface of the insulating material being covered with the semiconductor layer;
   a plurality of memory cells provided on the semiconductor layer, the memory cells comprising:
   a first dielectric film provided by covering the surface of the semiconductor layer;
   a plurality of charge storage layers, each of which is provided above the insulating material and on the first dielectric film;
   a plurality of second dielectric films, each of which is provided on the each charge storage layer;
   a plurality of conductive layers, each of which is provided on the each second dielectric film; and an impurity diffusion layer formed partially or overall at least above the insulating material and inside the semiconductor layer and at least a portion of a bottom end thereof being provided by an upper surface of the insulating material;

a semiconductor compound layer containing at least one of nitrogen and carbon and provided by covering the entire surface of the insulating material; and a select-gate transistor provided on the semiconductor substrate, the select-gate transistor comprising:

a third dielectric film provided by covering a surface of the semiconductor substrate; and a second conductive layer provided on the third dielectric film, wherein the insulating material is provided under the memory cells and is not provided under the select-gate transistor.

3. A nonvolatile semiconductor memory device comprising:

a semiconductor substrate having a semiconductor layer and an insulating material provided on a surface thereof, a surface of the insulating material being covered with the semiconductor layer;

a plurality of memory cells provided on the semiconductor layer, the memory cells comprising:

a first dielectric film provided by covering the surface of the semiconductor layer;

a plurality of charge storage layers, each of which is provided above the insulating material and on the first dielectric film;

a plurality of second dielectric films, each of which is provided on the each charge storage layer;

a plurality of conductive layers, each of which is provided on the each second dielectric film; and an impurity diffusion layer formed partially or overall at least above the insulating material and inside the semiconductor layer and at least a portion of a bottom end thereof being provided by an upper surface of the insulating material;

a semiconductor compound layer containing at least nitrogen, having nitrogen concentrations higher than those of the insulating material, and provided at an interface at least between the upper surface of the insulating material and the semiconductor layer; and a select-gate transistor provided on the semiconductor substrate, the select-gate transistor comprising:

a third dielectric film provided by covering a surface of the semiconductor substrate; and a second conductive layer provided on the third dielectric film, wherein the insulating material is provided under the memory cells and is not provided under the select-gate transistor.

* * * * *